(12) United States Patent
Luan

(10) Patent No.: US 12,368,125 B2
(45) Date of Patent: Jul. 22, 2025

(54) PACKAGE WITH POLYMER PILLARS AND RAISED PORTIONS

(71) Applicant: STMICROELECTRONICS PTE LTD, Singapore (SG)

(72) Inventor: Jing-En Luan, Singapore (SG)

(73) Assignee: STMICROELECTRONICS PTE LTD, Singapore (SG)

( * ) Notice: Subject to any disclaimer, the term of this patent is extended or adjusted under 35 U.S.C. 154(b) by 151 days.

(21) Appl. No.: 17/522,717

(22) Filed: Nov. 9, 2021

(65) Prior Publication Data

US 2022/0165699 A1 May 26, 2022

Related U.S. Application Data

(60) Provisional application No. 63/116,694, filed on Nov. 20, 2020.

(51) Int. Cl.
*H01L 23/00* (2006.01)

(52) U.S. Cl.
CPC ............. *H01L 24/20* (2013.01); *H01L 24/19* (2013.01); *H01L 24/94* (2013.01); *H01L 2224/2101* (2013.01); *H01L 2224/2105* (2013.01)

(58) Field of Classification Search
CPC ............ H01L 24/94; H01L 2224/2101; H01L 2224/21052
See application file for complete search history.

(56) References Cited

U.S. PATENT DOCUMENTS 7,759,799 B2  7/2010  Ejima
8,766,453 B2  7/2014  Uehling et al.
(Continued)

FOREIGN PATENT DOCUMENTS

CN   110660684 A   1/2020
CN   111725074 A   9/2020

OTHER PUBLICATIONS

Qiu et al., "Evaluation and Benchmarking of Cu Pillar Micro-bumps with Printed Polymer Core," *ICEP 2019 Proceedings*, WD1-2, pp. 24-27.
(Continued)

*Primary Examiner* — Trang Q Tran
(74) *Attorney, Agent, or Firm* — SEED IP LAW GROUP LLP

(57) ABSTRACT

The present disclosure is directed to semiconductor packages that include a molding compound having at least one raised portion that extends outward from the package. In some embodiments, the semiconductor packages have a plurality of raised portions, and a plurality of conductive layers are on the plurality of raised portions. The plurality of raised portions and the plurality of conductive layers are utilized to mount the semiconductor packages to an external electronic device (e.g., a printed circuit board (PCB), another semiconductor package, an external electrical connection, etc.). In some embodiments, the semiconductor packages have a single raised portion with a plurality of conductive layers that are on the single raised portion. The single raised portion and the plurality of conductive layers are utilized to mount the semiconductor packages to the external electronic device. The plurality of conductive layers on the plurality of raised portions or the single raised portion may be formed by a laser direct structuring (LDS) process.

20 Claims, 15 Drawing Sheets

(56) References Cited

U.S. PATENT DOCUMENTS

| | | |
|---|---|---|
| 9,515,039 B2 | 12/2016 | Lai et al. |
| 2008/0048321 A1 | 2/2008 | Chan |
| 2010/0127386 A1* | 5/2010 | Meyer-Berg ........ H01L 23/3107 |
| | | 257/E23.068 |
| 2011/0003470 A1 | 1/2011 | Burgess et al. |
| 2011/0278736 A1 | 11/2011 | Lin et al. |
| 2021/0028150 A1* | 1/2021 | Yen ..................... H01L 23/5386 |

OTHER PUBLICATIONS

Jung et al., "Development of Compliant Cu Pillar for Flip Chip Package," IEEE 17th Electronics Packaging and Technology Conference (EPTC), Dec. 2-4, 2015, 4 pages.

* cited by examiner

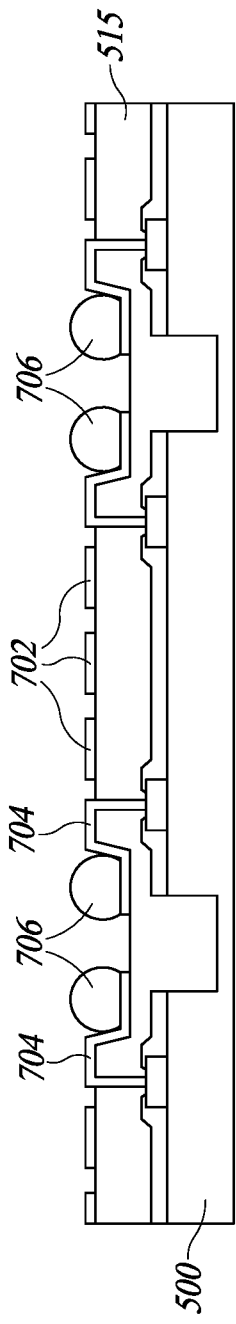
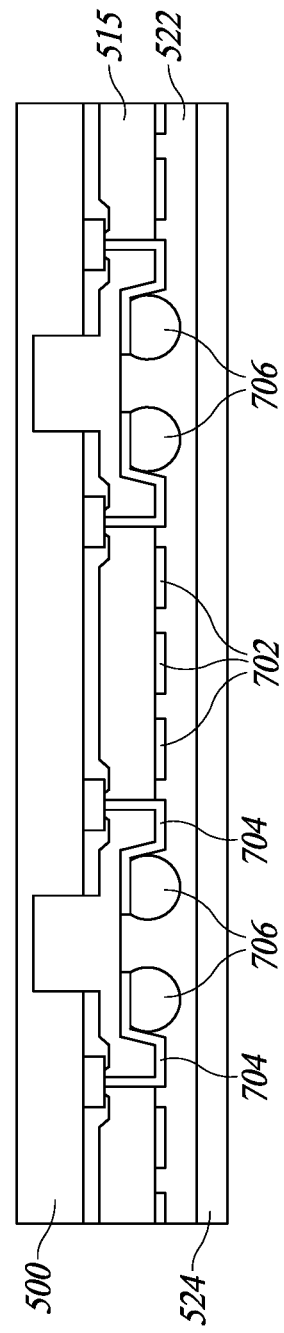
FIG. 12C
FIG. 12D

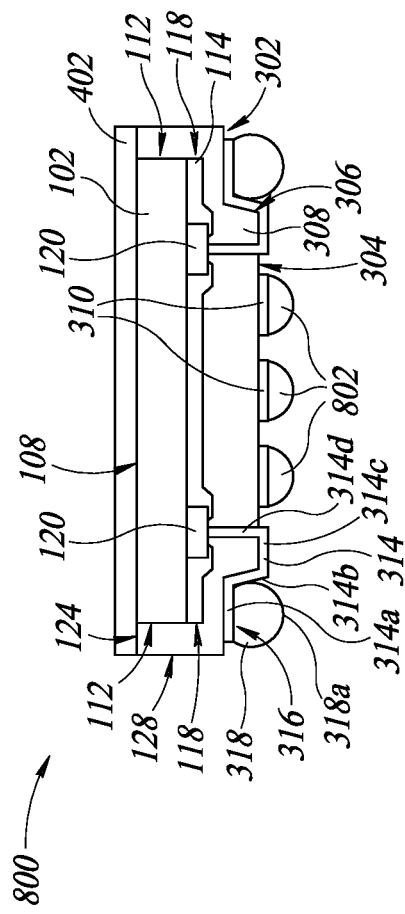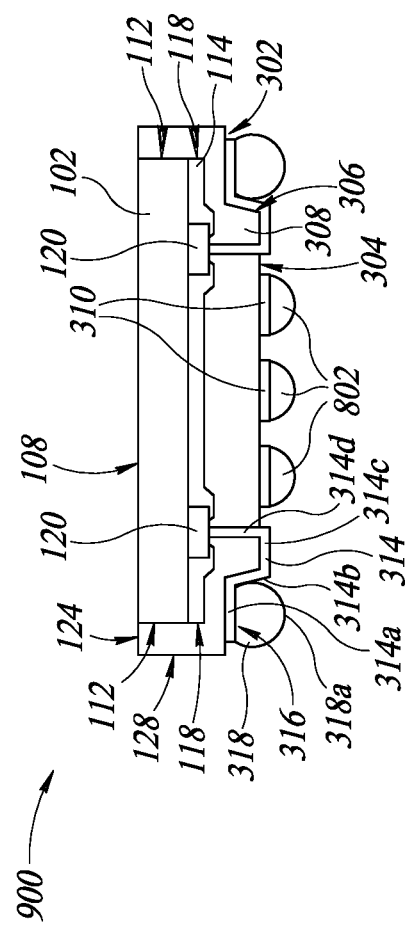

PACKAGE WITH POLYMER PILLARS AND RAISED PORTIONS

BACKGROUND

Technical Field

The present disclosure is directed to a package with a polymer including pillars or raised portions.

Description of the Related Art

Generally, semiconductor device packages, such as chip scale packages or wafer level chip scale packages (WLCSPs), contain semiconductor devices, semiconductor die, or integrated circuit die that are encased in a molding compound, a polymer, an encapsulant, etc. The semiconductor devices, semiconductor die, or integrated circuit die may be sensors configured to detect any number of quantities or qualities, or may be controllers utilized to control various other electronic components. For example, such semiconductor device packages may detect light, temperature, sound, pressure, stress, strain or any other quantities or qualities. Other semiconductor devices, semiconductor die, or integrated circuit die may be controllers, microprocessors, memory, or some other type of semiconductor device, semiconductor die, or integrated circuit die.

A conventional WLCSP may be formed to include conductive pads to which a solder material is coupled to directly for mounting to an electronic component. Usually, the solder material is in the form of solder balls that all have substantially the same shape and size as each other such that the WLCSP may be level when mounted or coupled to a printed circuit board (PCB), a surface of an electronic device, or some other electronic component. For example, a redistribution layer may be formed on a surface of a die and a plurality of conductive pads are formed in the redistribution layer and are exposed such that the solder balls may be coupled to the conductive pads.

When the conventional WLCSP is mounted to a PCB, there is a significant thermal mismatch between a die of the conventional WLCSP and the PCB to which it is mounted. Usually, the die has a coefficient of thermal expansion (CTE) that is less than a CTE of the PCB. This difference in the CTEs results in the die and the PCB expanding and contracting by different amounts when exposed to changes in temperature (e.g., from cold to hot, or hot to cold). The solder balls are exposed to these differences in expansion and contraction and may lead to failure in the solder balls such as cracking, shearing, breaking, or some other similar failure occurring within the solder balls. This failure may result in the conventional WLCSP to malfunction, which may ultimately lead to failure of an electronic devices functionality in which the conventional WLCSP is present or utilized.

When solder balls are formed on conductive pads of the conventional WLCSP to be mounted to the PCB, the conductive pads must be spaced apart by a relatively large distance to as compared to the solder balls to avoid the solder balls from cross-talk with solder balls that are adjacent to each other. For example, if during a reflow process to mount the WLCSP to the PCB utilizing the solder balls, the solder balls may come into physical contact with each other or may come close enough with each other to result in arcing causing cross-talk between the adjacent solder balls resulting in the WLCSP not functioning appropriately or as expected. This inappropriate functioning may significantly reduce the usability of an electronic device a whole, which may be a phone, a smart phone, a tablet, a television, a computer, a laptop, a camera, or some other electronic device in which the semiconductor package is present within.

BRIEF SUMMARY

Embodiments of the present disclosure overcome challenges associated with the conventional WLCSPs as well as other conventional semiconductor device packages that utilized solder balls as discussed above. One challenge is to reduce the likelihood of failure in semiconductor device packages due to differences in coefficients of thermal expansion (CTEs) of various materials of semiconductor device packages due to thermal cycling on board (TCOB), which is when the semiconductor device packages are exposed to changes in temperature (e.g., from cold to hot, or hot to cold).

The present disclosure is directed to various embodiments of semiconductor device packages including a die having a first surface and a second surface opposite to the first surface, and conductive pads on the first surface of the die.

In some embodiments, the first surface of the die is covered by a molding compound having a third surface from which a plurality of raised portions (e.g., a pillar, a column, a tower, etc.) extend outward. The raised portions extend away from the die and the raised portions each include a fourth surface further away from the die than the third surface of the molding compound and a fifth surface extending from the third surface of the molding compound to the fourth surface. The fifth surfaces are at an incline and are transverse to the third surface and the fourth surfaces. Conductive layers are on the molding compound and the plurality of raised portions to couple an exterior-most contact pad to a contact pad on the die. Each of the conductive layers has a first portion on each of a corresponding fourth surface, a second portion on a corresponding fifth surface, a third portion on a corresponding third surface, and a fourth portion extending into the third surface of the molding compound and being coupled to one of the conductive pads of the die.

In some embodiments, the first surface of the die is covered by a molding compound having a third surface from which a raised portion extends. The raised portion extends away from the die. The raised portion includes a fourth surface further away from the die than the third surface and a fifth surface is at an incline and is transverse to the third surface and the fourth surface. A conductive layer has a first portion on the third surface, a second portion on the fifth surface, a third portion on the fourth surface, and a fourth portion extending into the fourth surface of the molding compound and being coupled to one of the conductive pads of the die.

A method of manufacturing the plurality of raised portions in the some embodiments includes forming recesses in a surface of a wafer by removing portions of the wafer, forming a molding compound on the wafer and filling the recesses, and forming the raised portions in the molding compound by removing portions of the molding compound. The method of manufacturing the plurality of raised portions further includes forming openings in the molding compound exposing conductive pads of the wafer, and forming conductive layers on the raised portions and in the openings coupling the conductive layers to the conductive pads exposed by the openings. After the above steps, the wafer is singulated forming a plurality of WLCSPs.

A method of manufacturing the raised portion in the some embodiments includes, forming recesses in a surface of a wafer by removing portions of the wafer, forming a molding compound on the wafer filling the recesses, and forming the raised portion by removing portions of the molding compound. The method of manufacturing the raised portion further includes forming openings in the molding compound exposing conductive pads of the wafer, and forming conductive layers on the raised portion and in the openings coupling the conductive layers to the conductive pads. After the above steps, the wafer is singulated forming a plurality of WLCSPs.

In view of the above discussions, the solder balls of the conventional WLCSPs are no longer required at each and every bonding pad of the conventional WLCSPs or may not be required at all of the bonding pads when coupling the conventional WLCSPs to the PCB. By removing the need for the solder balls at each and every bonding pad or all of the bonding pads, the effects of the CTE mismatch between the die of the conventional WLCSPs and the PCB to which the conventional WLCSPs are mounted may be reduced. For example, the effects of the expansion and contraction difference caused by the CTE mismatch between the WLCSPs of the present disclosure and the PCB is less than that as compared to the effects of the expansion and contraction difference caused by the CTE mismatch between the conventional WLCSPs of the and the PCB. This lesser difference of expansion and contraction reduces the effects of CTE mismatch between the die of the WLCSPs of the present disclosure and the PCB to which the WLCSPs of the present disclosure are mounted reducing the likelihood of defects, malfunctions, or failures of electrical connections between the WLCSP of the present disclosure and the PCB.

DESCRIPTION OF THE SEVERAL VIEWS OF THE DRAWINGS

For a better understanding of the embodiments, reference will now be made by way of example to the accompanying drawings. In the drawings, identical reference numbers identify similar elements or acts unless the context indicates otherwise. The sizes and relative proportions of the elements in the drawings are not necessarily drawn to scale. For example, some of these elements may be enlarged and positioned to improve drawing legibility.

FIGS. 12A-12D are directed to a method of manufacturing the embodiment of the package in FIG. 6;

FIGS. 14A and 14B are directed to an alternative method of manufacturing the embodiment of the package in FIG. 7; and FIG. 15 is directed to an alternative method of manufacturing the embodiment of the package in FIG. 7.

DETAILED DESCRIPTION

Figure 1:
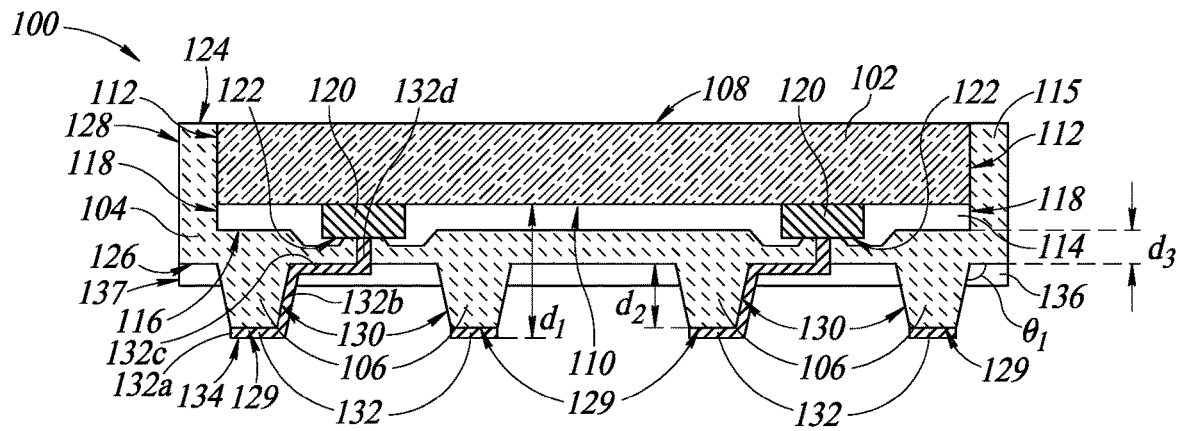
FIG. 1 is directed a cross-sectional view of an embodiment of a package taken along line A-A in FIGS. 3, 4, and 5.

In the following description, certain specific details are set forth in order to provide a thorough understanding of various embodiments of the disclosure. However, one skilled in the art will understand that the disclosure may be practiced without these specific details. In other instances, well-known structures associated with electronic components, packages, and semiconductor fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second, third, etc., does not necessarily imply a ranked sense of order, but rather may only distinguish between multiple instances of an act or a similar structure or material.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The terms "left," and "right," are used for only discussion purposes based on the orientation of the components in the discussion of the Figures in the present disclosure as follows. These terms are not limiting as the possible positions explicitly disclosed, implicitly disclosed, or inherently disclosed in the present disclosure.

The term "substantially" is used to clarify that there may be slight differences when a package is manufactured in the real world, as nothing can be made perfectly equal or perfectly the same. In other words, substantially means that there may be some slight variation in actual practice and instead is made within accepted tolerances.

As used in this specification and the appended claims, the singular forms "a," "an," and "the" include plural referents unless the content clearly dictates otherwise.

While various embodiments are shown and described with respect to semiconductor die and semiconductor packages, it will be readily appreciated that embodiments of the present disclosure are not limited thereto. In various embodiments, the structures, devices, methods and the like described herein may be embodied in or otherwise utilized in any suitable type or form of semiconductor die or packages, and may be manufactured utilizing any suitable semiconductor die and packaging technologies as desired.

In the present disclosure, embodiments of semiconductor packages include a molding compound having a raised portion or a plurality of raised portions (e.g., pillars, columns, elevated portions, tower, etc.) that extend outward from the semiconductor packages and extend away from the die. Conductive layers are formed on the raised portion or the plurality of raised portions and the conductive layers are utilized to mount the embodiments of the semiconductor packages within an electronic device. The conductive layers are in electrical communication with electric components within the semiconductor packages.

Figure 3:
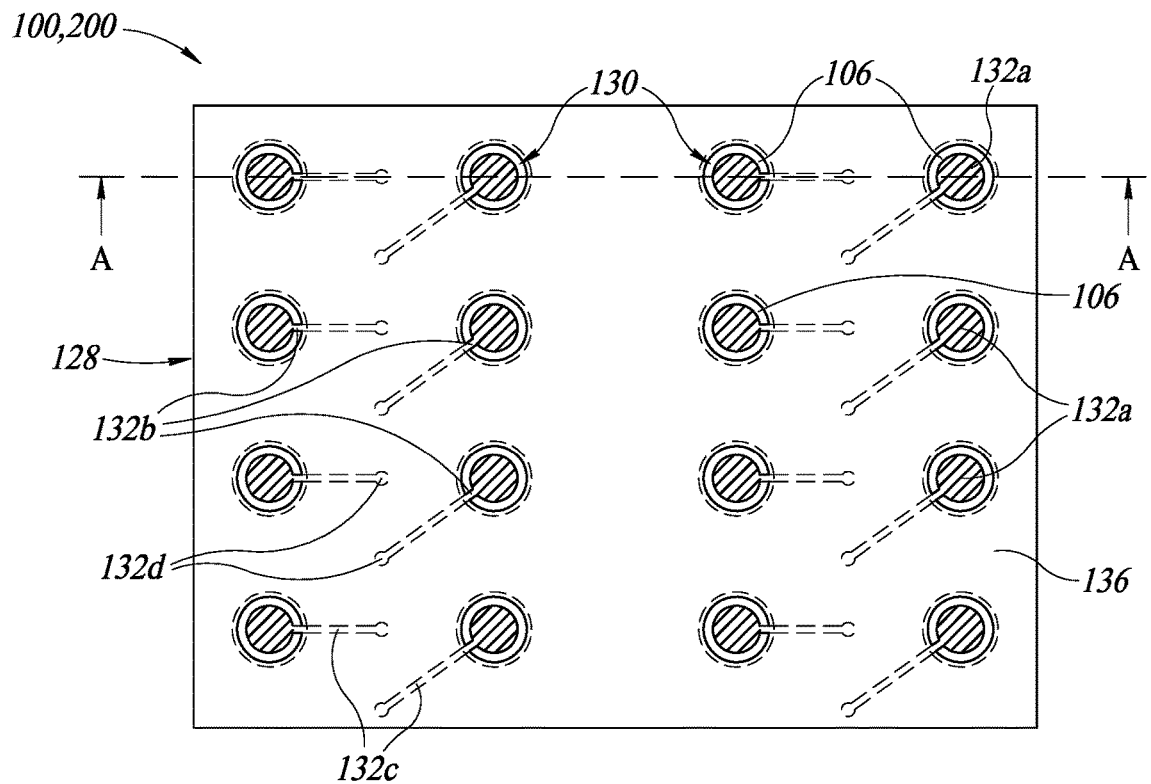
FIG. 3 is directed to a bottom-plan view of the embodiment of the package in FIG. 1 and the alternative embodiment of the package in FIG. 2.
Figure 4:
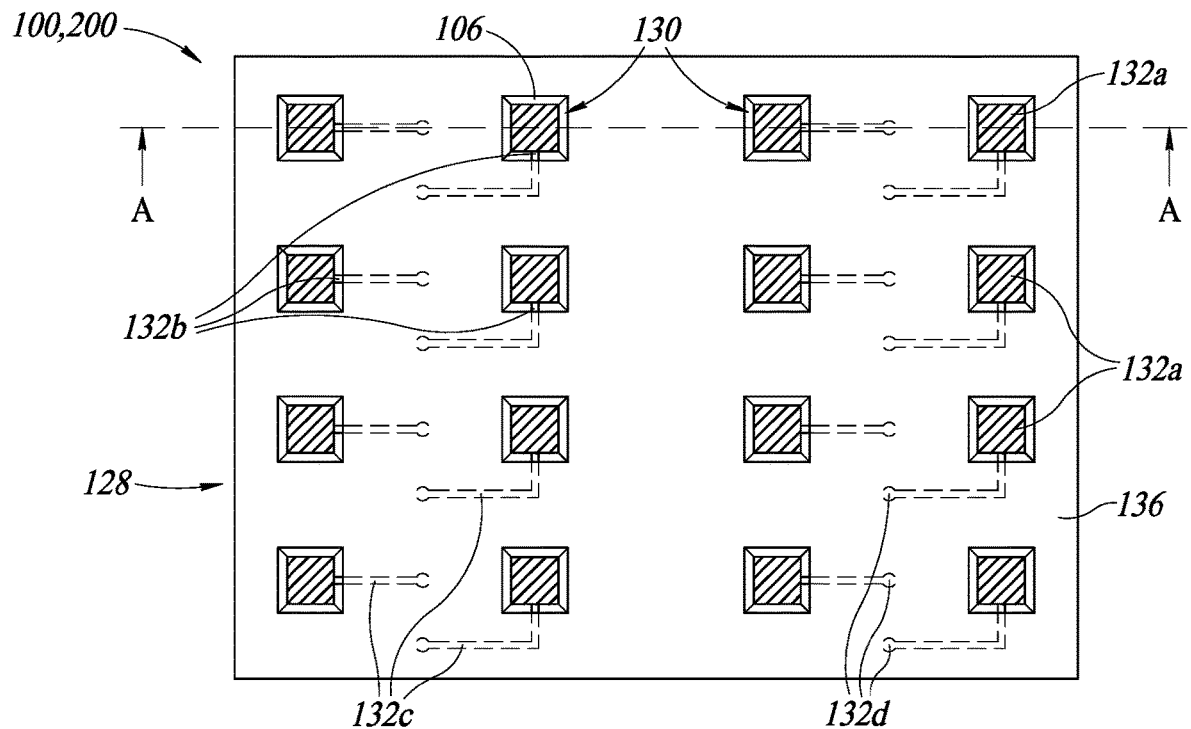
FIG. 4 is directed to a bottom-plan view of an alternative embodiment of a package.
Figure 5:
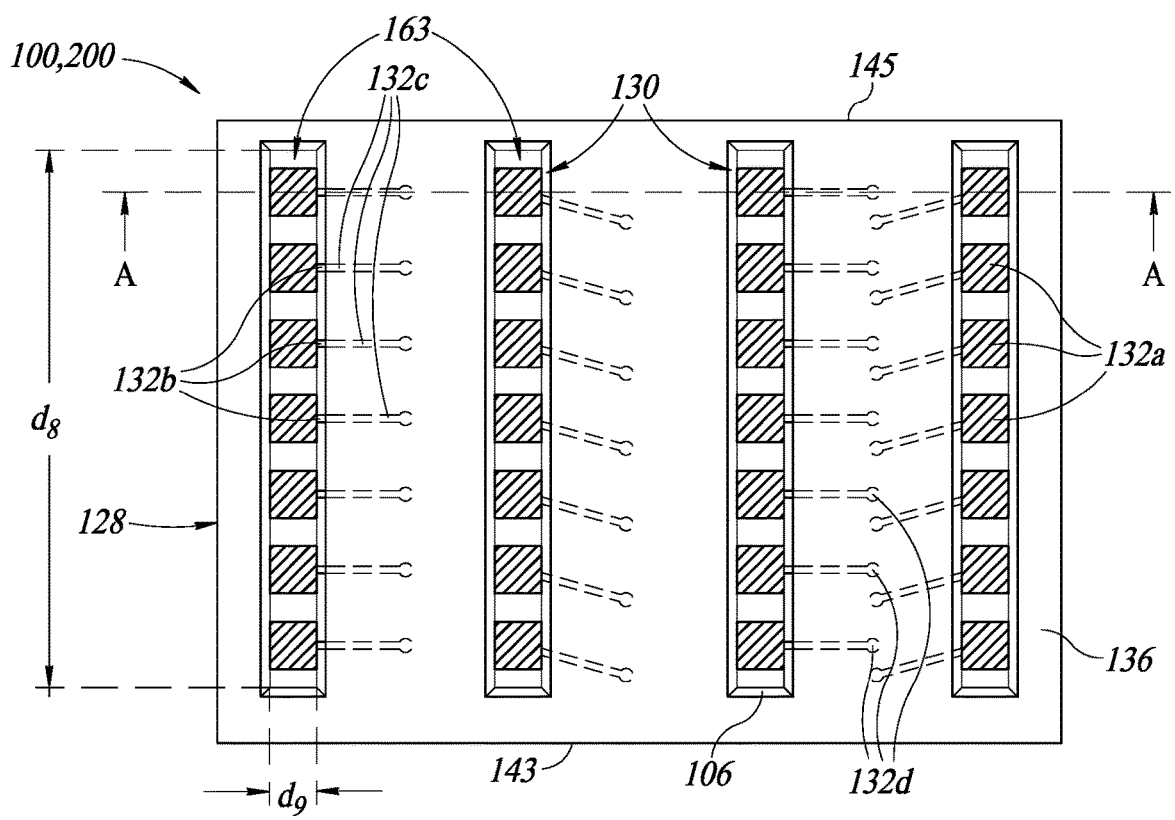
FIG. 5 is directed to a bottom-plan view of an alternative embodiment of a package.

FIG. 1 is a cross-sectional view of an embodiment of a package 100 taken along line A-A in FIG. 3. Even though FIGS. 3, 4, and 5 are different embodiments, the cross-sectional views can be represented by FIG. 1. The package 100 may be referred to as a wafer level chip scale package (WLCSP). The package 100 includes a die 102 encased within a molding compound 104 having a plurality of raised portions 106 that extend away from the die 102. The molding compound 104 may be an encapsulant, a polymer, a resin, a dielectric, or some other type of material for encasing, covering, and protecting components of the package 100. The plurality of raised portions 106 may be referred to as a plurality of extensions, a plurality of pillars, a plurality of support structures, a plurality of contact support structures or some other terminology for a portion of the molding compound 104 extending away from the die 102 within the package 100. The plurality of raised portions 106 will be referred to henceforth as a plurality of pillars 106. The plurality of pillars 106 space the die 102 apart from a surface to which the package 100 is coupled or mounted. For example, the surface may be a surface of an electronic component, a printed circuit board (PCB), a kapton tape, a carrier, a support, a substrate, or some other surface upon which the package 100 may be mounted. For the purposes of the following discussions, the surface of the electronic component to which the package 100 is mounted to will be a surface of a PCB. As will be discussed in greater detail later on in the present disclosure, the plurality of pillars 106 reduce a likelihood of malfunctioning or failure of electrical connections between the PCB and the package 100 as compared to when solder balls are used to form electrical connections between a conventional package and the PCB.

The molding compound 104 may be doped with an additive material that is present within the molding compound 104 such that a laser direct structuring (LDS) process may be performed. For example, the additive material may be an inorganic metallic compound within the molding compound 104 that is exposed to a laser, which causes a chemical reaction that activates the non-conductive inorganic metallic compound. A conductive metallic compound or a conductive metal layer is formed by activating the non-conductive inorganic metallic compound with the laser. The metal within the non-conductive inorganic metallic compound may be a copper material, a gold material, a silver material, or some other type of conductive material.

For example, the molding compound 104 may be an LDS compatible polymer such as KMC-9200 from Shin Etsu, EME-L series from Sumikon, or may be some other type of LDS compatible polymer, resin, molding compound, or encapsulant material.

The die 102 includes a first surface 108, a second surface 110 opposite to the first surface 108, and a plurality of sidewalls 112 extend from the first surface 108 to the second surface 110. The die 102 may be an integrated circuit die, an application-specific integrated circuit (ASIC) die, a controller die, a sensor die, or some other suitable device. If the die is a sensor die, the die 102 may be configured to detect sound, temperature, pressure, vibration, light, or some other quantity or quality. For example, the die 102 may include a sensor that is a micro-electromechanical system (MEMS) pressure sensor, which may be a membrane pressure sensor or a cantilever beam pressure sensor. Alternatively, if the die 102 is an integrated circuit die, an ASIC die, or a controller die, the die 102 may be configured to control other electronic components or die within an electronic device. The die 102 may be made of a silicon material, a semiconductor material, or some other material or combination of materials suitable to form a die.

A redistribution layer (RDL) 114 is on the second surface 110 of the die 102. The RDL 114 may be a multiple layers of a re-passivation material, a passivation material, an insulating material, a conductive material, or some other combination of materials or stacked materials. The RDL 114 includes a surface 116 that faces away from the die 102 and a plurality of sidewalls 118 that extend from the second surface 110 of the die 102 to the surface 116 of the RDL 114. Each one of the sidewalls 118 of the RDL 114 is aligned with a corresponding one of the sidewalls 112 of the die 102.

A plurality of conductive pads 120 in the RDL 114 are in electrical communication with electrical connections (not shown) internally within the die 102. These internal electrical connections within the die 102 may be conductive vias, conductive layers, conductive traces, or some other electrical connection or combination of electrical connections. Each one of the conductive pads 120 has a surface 122 that is exposed from the RDL 114. The conductive pads 120 may be referred to as conductive layers.

The molding compound 104 covers the sidewalls 112, 118 of the die 102 and covers the surface 116 of the RDL 114. The molding compound has a first surface 124, a second surface 126 opposite to the first surface 124, and a plurality of sidewalls 128 that extend from the first surface 124 to the second surface 126. The first surface 124 of the molding compound 104 is substantially co-planar and flush with the first surface 108 of the die 102. In some alternative embodiments, the molding compound 104 may cover the first surface 108 of the die 102.

The molding compound 104 entirely covers the sidewalls 112, 118 of the die 102, and the molding compound entirely covers the surface 116 of the RDL 114. In some embodiments, the RDL 114 may not be present on the second surface 108 of the die 102, and, in this embodiment, the molding compound 104 may be directly on and entirely covering the second surface 110 of the die 102.

As discussed earlier, the molding compound 104 has the plurality of pillars 106 that extend away from the die 102. Each one of the plurality of pillars 106 includes a first surface 129 that is spaced apart from the second surface 126 of the molding compound 104, and a second surface 130 that extends from the second surface 126 of the molding compound 104 to a corresponding one of the first surfaces 129 of the plurality of pillars 106. The second surfaces 130 of the plurality of pillars 106 are at an incline and may be referred to as an inclined surface or angled surface. The second surfaces 130 of the plurality of pillars 106 are at an oblique angle $\theta_1$ to the second surface 126 of the molding compound 104. The plurality of pillars 106 are spaced apart from the sidewalls 128 of the molding compound 104. The plurality of pillars 106 may have a circular shape as seen in FIG. 3, a square shape as seen in FIG. 4, a rectangular shape as seen in FIG. 5, or some other shape or combination of shapes.

In some embodiments, the angle $\theta_1$ of the second surfaces 130 of the pillars 106 may be at a perpendicular angle (e.g., 90-degrees) to the second surface 126 of the molding compound 104. When the second surfaces 130 of the pillars 106 are perpendicular to the second surface 126 of the molding compound 104, the second surfaces 130 of the pillars 106 are substantially vertical with respect to the second surface 126 of the molding compound 104, and the pillars 106 are substantially cylindrical.

A plurality of conductive layers 132 are on the plurality of pillars 106 and extend into the second surface 126 of the molding compound 104. Each one of the plurality of conductive layers 132 is coupled to a corresponding one of the plurality of conductive pads 120. The conductive layers 132 coupled to the conductive pads 120 provide a path for signals to be communicated to the die 102 from external electrical components and from the die 102 to external electrical components. Each one of the plurality of conductive layers 132 corresponds to at least one of the plurality of pillars 106. Each one of the plurality of conductive layers 132 may be a multilayer conductive structure. For example, the conductive layers 132 may each include a first conductive layer formed by a laser direct structuring process by activating an additive material (e.g., non-conductive inorganic metallic compound) within the molding compound 104, and a second conductive layer formed on the first conductive layer by a plating process. For example, the plurality of conductive layers 132 may include ones of the first conductive layers and ones of the second conductive layers stacked on corresponding ones of the first conductive layers. The formation of the conductive layers 132 will be discussed in greater detail with respect to method as shown in FIGS. 10A-10I of the present disclosure.

For purposes of brevity and simplicity sake, the conductive layer 132 on the left-most pillar 106 in FIG. 1 will be discussed in further detail. However, it should be noted that each of the conductive layers 132 will have the same or similar features of the conductive layer 132 on the left-most pillar 106 as follows. The conductive layer 132 on the left-most pillar 106 in FIG. 1 includes a first portion 132a on the first surface 129 of the left-most pillar 106, a second portion 132b on the second surface 130 of the left-most pillar 106, a third portion 132c on the second surface 126 of the molding compound 104, and a fourth portion 132d that extends into the second surface 126 of the molding compound 104 and is coupled to the left-most conductive pad 120 in FIG. 1. The first portion 132a is coupled to the second portion 132b, the second portion 132b is coupled to the third portion 132c, and the third portion 132c is coupled to the fourth portion 132d, which may be referred to as a conductive via. The first portion 132a of the conductive layer 132 on the left-most pillar 106 includes a surface 134 that may be utilized to couple the package 100 to an external electrical connection.

An insulating layer 136 is on the second surface 126 of the molding compound 104 and partially covers the surfaces 130 of the plurality of pillars 106. The insulating layer 136 is on and covers the third portions 132c and the fourth portions 132d of the conductive layers 132. The insulating layer reduces the chances of cross-talk between adjacent conductive layers 132 on adjacent pillars 106 as it covers the portions 132c, 132d that are closet to other portions of adjacent conductive layers 132. The insulting layer 136 may be a repassivation material, a passivation material, a non-conductive material, a dielectric material, or some other insulating material or combination of insulating materials. In other words, the insulating layer 136 may be referred to as a repassivation layer, a passivation layer, a non-conductive layer, a dielectric layer, or some other layer of insulating material or combination of insulating materials.

A distance $d_1$ by which the plurality of pillars 106 and the plurality of conductive layers 132 space the second surface 110 of the die 102 apart from a surface of the external electrical component to which the die 102 is mounted. The distance $d_1$ extends from surfaces 134 of the conductive layers 132 to the second surface 110 of the die 102. The distance $d_1$ is selected to reduce a likelihood of malfunctioning or failure of electrical connections between the die 102 and the PCB. The pillars 106 space apart the die 102 from a surface of the PCB to which the package 100 is coupled or mounted by the selected distance $d_1$. The selected distance $d_1$ is determined and selected based on coefficients of thermal expansion (CTE) of various materials that make up the package 100 as well as temperature changes the package 100 may be exposed to when in use.

Generally, a relatively large CTE mismatch exists between the die 102 and the PCB as the die 102 may have a CTE of approximately 2.8-parts per million (ppm)/° C. and the PCB may have a CTE ranging from approximately 14-ppm/° C. to 18-ppm/° C. This CTE mismatch may cause failure in connections coupling the die 102 to the PCB as the expansion and contraction between the die 102 and the PCB is significantly different due to changes in temperature. This difference in expansion and contraction results in stresses and strains in the connections between the die 102 and the PCB that may result in the connections malfunctioning or failing. However, to reduce the effects of this difference in expansion and contraction between the die 102 and the PCB the distance $d_1$ may be increased or decreased to limit the effects by this CTE mismatch.

Spacing the die 102 apart from the PCB by the plurality of pillars 106 of the molding compound 104 by the selected distance $d_1$ reduces the likelihood of malfunctioning or failure in the package 100 when compared to conventional packages. Generally, conventional packages are mounted to a PCB or external electronic component by a plurality of solder balls, and these solder balls come under stresses and strains caused by the differences in expansion and contraction of a die in the conventional package and the PCB similar to the package 100 of the present disclosure as discussed earlier. Generally, solder material of the solder balls has a CTE of approximately 24.5-ppm/° C., a die of the conventional package has a CTE of approximately 2.8-ppm/° C., a PCB has a CTE ranging from approximately 14-ppm/° C. to 18-ppm/° C., and a molding compound has a CTE of approximately 10-ppm/° C. The CTE of the solder balls is much larger than that of the PCB and the die of the conventional package, which means that likelihood of cracking or shearing in the solder is much greater than compared to the plurality of pillars 106 of the molding compound 104. Instead, the molding compound 104 has a CTE between the CTE of the die 102 and the PCB to which the package 100 is mounted. Furthermore, the effects of the CTE mismatch between the die 102 and the PCB can be further reduced by increasing the distance $d_1$ between the die 102 and the PCB.

If solder balls were used to increase a distance by which the die in the conventional package is spaced apart from the PCB to reduce these effects of CTE mismatch, the solder balls must be increased in size. When the solder balls are increased in size a diameter of the solder balls increases as well. This increase in the diameter means that a larger amount of space must be provided to avoid cross-talk between solder balls when reflowed to couple the conventional package to the PCB. To provide a greater amount of space the conventional package must increase in profile and size as well. Unlike the conventional package that must be increased in size to provide greater space for the solder balls, the package 100 does not need to be increased in size and the plurality of pillars 106 may be increased in size without having to provide more space to avoid cross-talk issues as with reflowing solder balls to form electrical connections.

The distance $d_1$ may be selected by adjusting a distance $d_2$ of the plurality of pillars 106, adjusting a distance $d_3$ of the molding compound 104, or both. The distance $d_2$ extends from the surface 116 of the RDL 114 to the second surface 126 of the molding compound 104. The distance $d_3$ extends from the surface 116 of the RDL 114 to the second surface 126 of the molding compound 104. In the package 100, the distance $d_2$ is greater than the distance $d_3$. However, in some other embodiments, the distance $d_2$ may be less than the distance $d_3$ or the distance $d_2$ may be substantially equal to the distance $d_3$.

An edge portion 115 of the molding compound 104 is adjacent to edges of the die 102, which are adjacent to the sidewalls 112 of the die 102. The edge portion 115 is around the pillars 106 and the die 102. The pillars 106 may be referred to as a central portions as the pillars 106 are closer to a center of the second surface of the die 102 than the portions of the molding compound 104 at the edges of the die 102.

Figure 2:
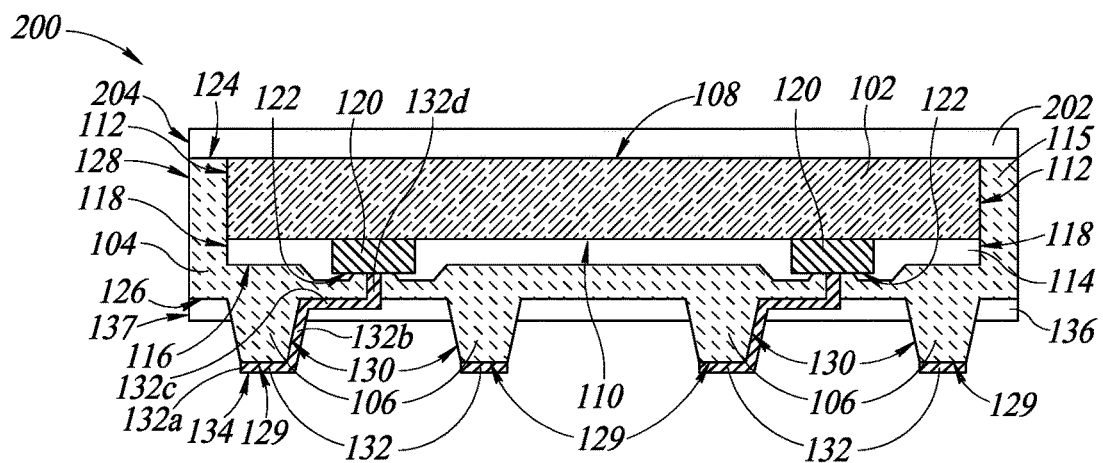
FIG. 2 is directed to a cross-sectional view of an alternative embodiment of a package taken along line A-A in FIGS. 3, 4, and 5, including an insulating layer as compared to the embodiment in FIG. 1.

FIG. 2 is directed to an alternative embodiment of a package 200 taken along line A-A in FIGS. 3, 4, and 5. Even though FIGS. 3, 4, and 5 are different embodiments, the cross-sectional views can be represented by FIG. 2. The package 200 is similar to the package 100 and only differences between the package 200 and the package 100 will be discussed in detail as follows.

The package 200 includes an insulating layer 202 on the first surface 108 of the die 102 and the first surface 124 of the molding compound 104. The insulating layer 202 may be referred to as a protective layer, a cap layer, or some other reference for a layer configured to protect the die 102. The insulating layer 202 may be a passivation material, a repassivation material, an epoxy material, a polymer material, a plastic material, a non-conductive material, or some other insulating material or combination of insulting materials. Sidewalls 204 of the insulating layer 202 are coplanar with sidewalls 128 of the molding compound 104 and with sidewalls 137 of the insulating layer 136.

FIG. 3 is directed to a bottom-plan view of either of the packages 100, 200 in FIGS. 1 and 2. The pillars 106 have a three-dimensional shape of a conical frustum or truncated cone. The first portions 132a of the conductive layers 132 have a circular shape when viewed in the bottom-plan view in FIG. 3. Each one of the conductive layers 132 is on and corresponds to one of the pillars 106. Other embodiments may not include a conductive layer at the end of some of the truncated cones.

Each of the first portions 132a are coupled to an extension or trace (second portions) 132b that couples to the die through the insulating layer 136. Some of the second portions 132b are covered by the insulating layer 136 and are shown as dashed. Some of these second portions 132b are positioned at angles with respect to each other to allow for condensed arrangement for space saving. The third portions 132c that are coupled to the second portions 132b are covered by the insulating layer 136. The second portions 132b, the third portions 132c, and the fourth portion 132d may be an electrical trace, an electrical extension or some suitable electrical connection.

The second surfaces 130 of the pillars are visible as they are angled from the most external end down to where the pillars are covered by the insulating layer 136. The angle $\theta_1$ may be 45-degrees, 60-degrees, 80-degrees, or some other suitable angle. In some embodiments, the angle $\theta_1$ of the second surfaces 130 of the pillars 106 may be at a perpendicular angle (e.g., 90-degrees) to the second surface 126 of the molding compound 104 such that the angled walls would not be visible in this bottom-plan view. When the second surfaces 130 of the pillars 106 are perpendicular to the second surface 126 of the molding compound 104, the second surfaces 130 of the pillars 106 are substantially vertical with respect to the second surface 126 of the molding compound 104, and the pillars 106 are substantially cylindrical shaped (e.g., circular prism).

FIG. 4 is directed to a bottom-plan view of either of the packages 100, 200 in FIGS. 1 and 2. The pillars 106 have a three-dimensional shape of a square or rectangular frustum or truncated pyramid. The first portions 132a of the conductive layers 132 have a square shape when viewed in the bottom-plan view in FIG. 4. Each one of the conductive layers 132 is on and corresponds to one of the pillars 106. The side surfaces 130 of the pillars 106 are at an oblique angle to the second surface 126 of the molding compound 104.

In some embodiments, the second surfaces 130 of the pillars 106 may be perpendicular to the second surface 126 of the molding compound 104 as compared to the angled sidewalls illustrated. When the second surfaces 130 of the pillars 106 are perpendicular to the second surface 126 of the molding compound 104, the second surfaces 130 are substantially vertical with respect to the second surface 126 of the molding compound 104, and the pillars 106 are substantially cube shaped (e.g., a cube prism) or cuboid shaped (e.g., a rectangular prism).

Some of the electrical traces, which include the second portions 132b, include some of the second portions 132b of some of the electrical traces being transverse to other ones of the second portions 132b of other ones of the electrical traces. The second portions 132b transverse to others of the second portions 132b may be at an angle to allow for condensed arrangement for space saving. The angle may be 30-degrees, 40-degrees, 50-degrees, 90-degrees, or some other suitable angle by which the second portions 132b are transverse to the others of the second portions 132b of other ones of the electrical traces.

FIG. 5 is directed to a top plan view of either of the packages 100, 200 in FIGS. 1 and 2. The pillars 106 have a three-dimensional shape of a rectangular frustum or an elongated pyramid. The first portions 132a of the conductive layers 132 have a square shape when viewed in the bottom-plan view in FIG. 5. Multiple of the conductive layers 132 are on and correspond to one of the pillars 106. The pillars extend in a direction directed from a first edge 143 of the package 100, 200 towards a second edge 145 of the package 100, 200. The pillars 106 are continuous rectangular frustums or 3-D trapezoids that have multiple of the first portions 132a, which may be contact pads, mounting pads, or bonding pads, that are on the surfaces 129 of the pillars 106. The pillars 106 are continuous and have portions that extend between ones of the first portions 132a of the conductive layer 132.

In this embodiment, there are four pillars 106 that are substantially parallel to each other. The second surfaces 130 of the pillars 106 have a distance $d_8$ that extends in the direction directed from the first edge 143 towards the second edge 145. The pillars 106 each have a surface 163 that is transverse to the second surfaces 130. The surfaces 163 are transverse to the second surfaces 130 and extends between opposite ones of the second surfaces 130 of the pillars 106. The surfaces 163 have a distance $d_9$ that extends in a direction transverse to the distance $d_8$ of the surfaces 163. The distance $d_9$ is less than the distance $d_8$.

In some embodiments, the pillars 106 may be differently sized and shaped from each other such that the dimensions $d_8$, $d_9$ are not the same or similar between the separate and distinct pillars 106. For example, the distance $d_8$ of one of the pillars 106 may be larger than other ones of the pillars 106, or the distance $d_9$ of one of the pillars 106 may be less than the distance $d_9$ for other ones of the pillars 106.

Some of electrical traces, which include the second portions 132b and the third portions 132c, include the second portion 132b being transverse to the third portion 132c by an angle to allow for condensed arrangement for space saving. The angle may be 90-degrees, 40 degrees, 30 degrees, or some other suitable angle by which the second portions 132b are transverse to the third portions 132c.

In some embodiments, the second surfaces 130 of the pillars 106 may be perpendicular to the second surface 126 of the molding compound 104. When the second surfaces 130 of the pillars 106 are perpendicular to the second surface 126 of the molding compound 104, the second surfaces 130 are substantially vertical with respect to the second surface 126 of the molding compound 104, and the pillars 106 are substantially cuboid shaped (e.g., a rectangular prism).

In view of the bottom-plan views of the packages 100, 200 in FIGS. 3A-3C, in some embodiments, the pillars 106 may have a three-dimensional shape a trapezoidal frustum/prism, a triangular frustum/prism, ovular frustum/prism, or some other three-dimensional frustum or prism. In some other embodiments, the conductive layers 132 may have an ovular shape, a rectangular shape, a trapezoidal shape, or some other shape when viewed in the bottom-plan view.

Figure 6:
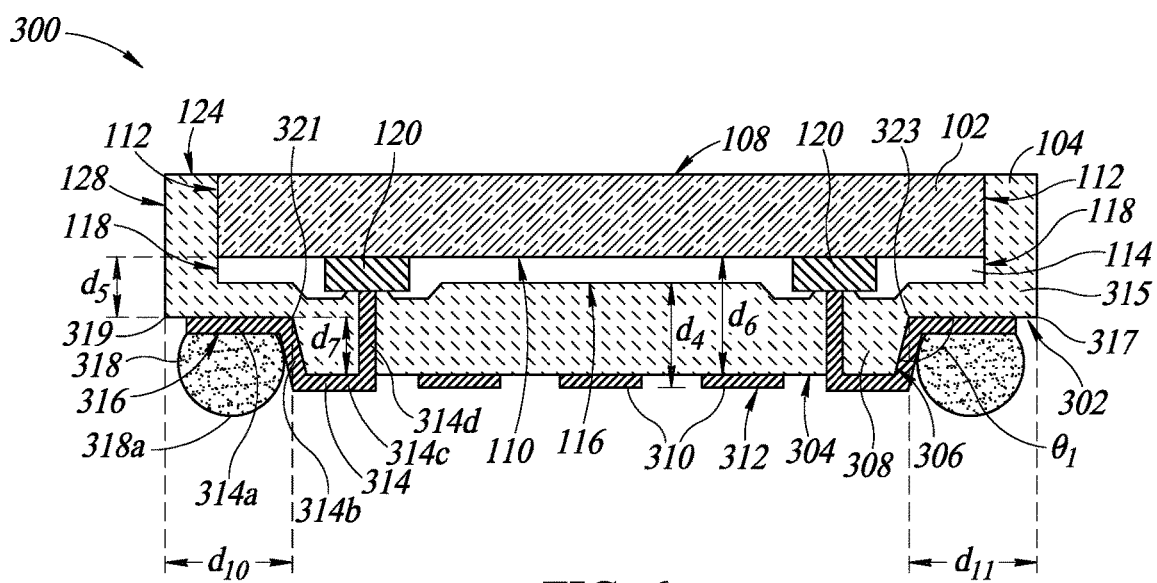
FIG. 6 is directed to a cross-sectional view of an embodiment of a package taken along line B-B in FIGS. 8 and 9.
Figure 8:
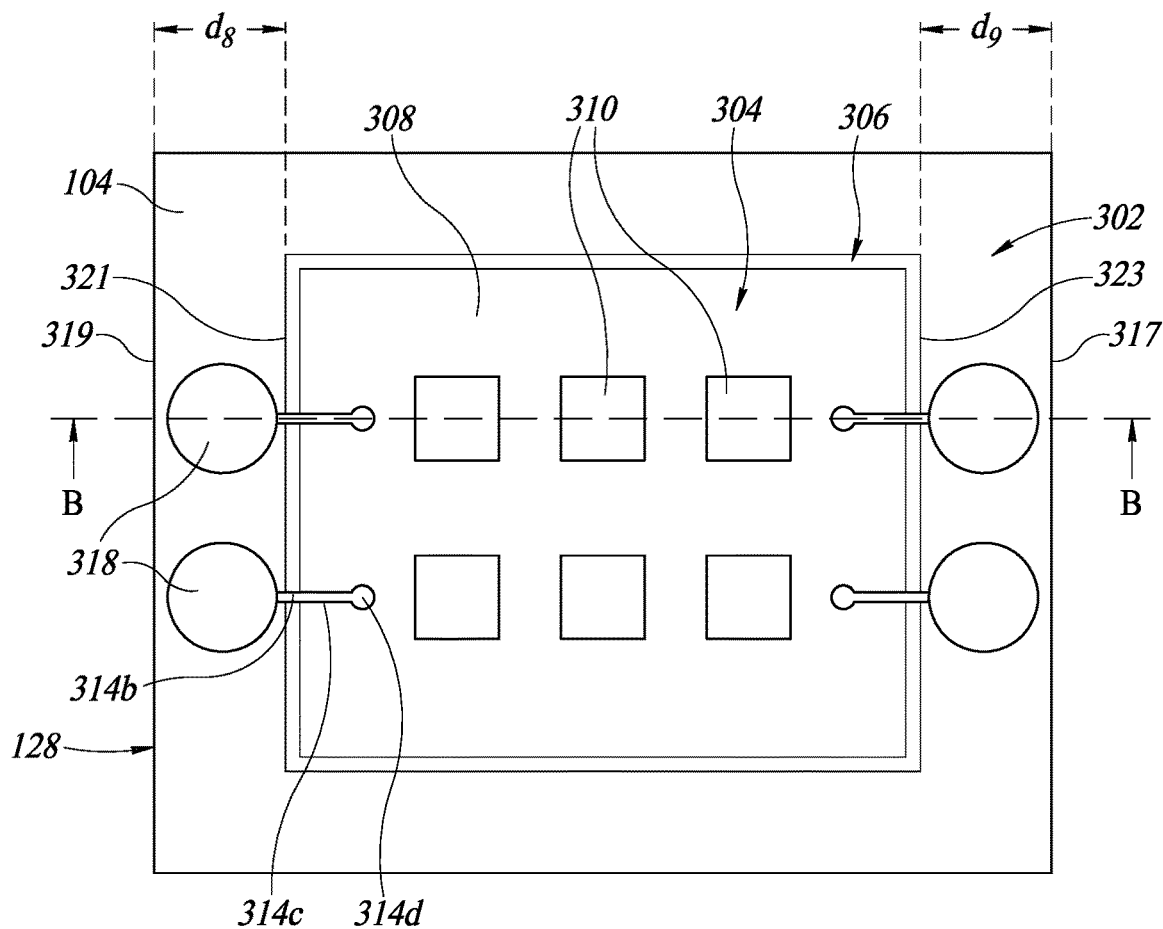
FIG. 8 is directed to a bottom-plan view of the embodiment of the package in FIG. 6 and the alternative embodiment in FIG. 7.
Figure 9:
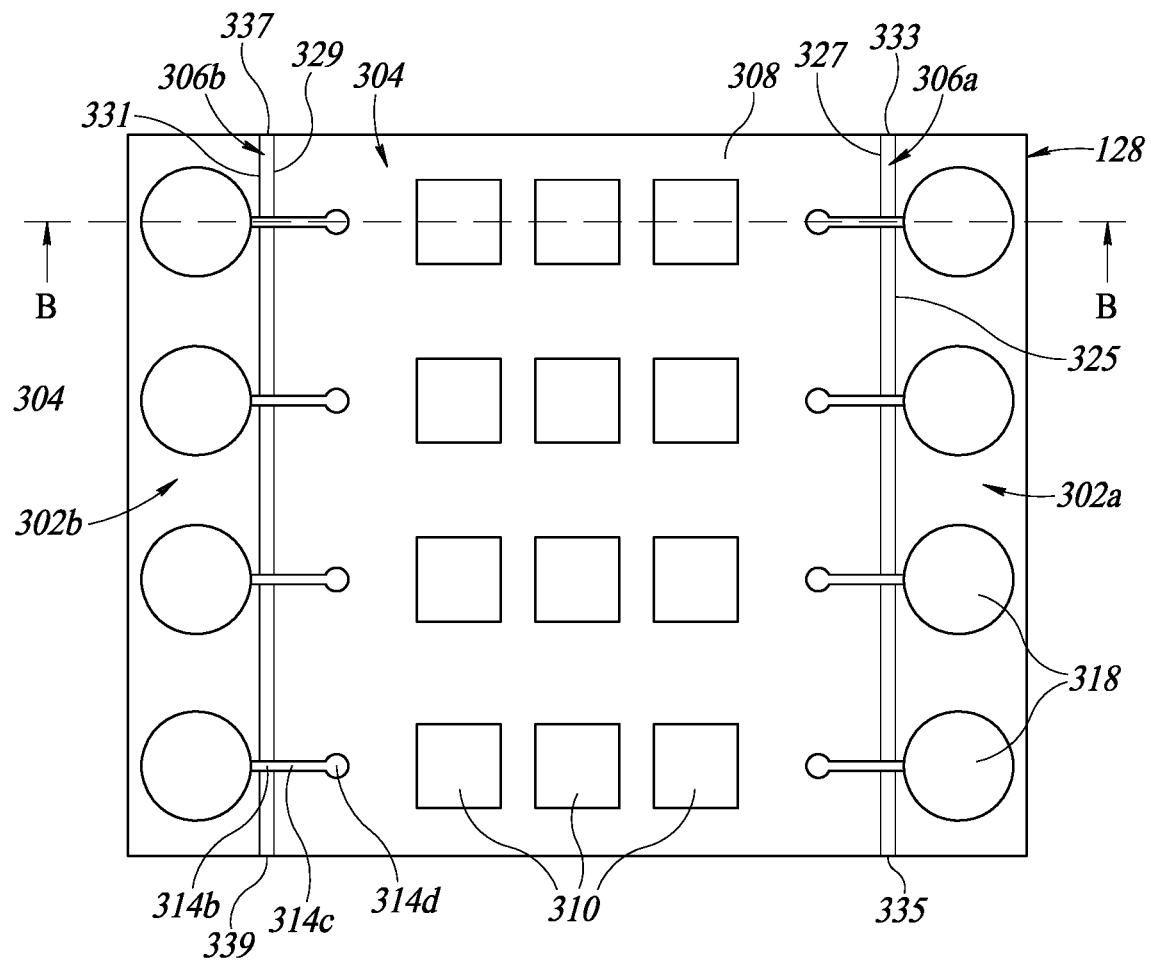
FIG. 9 is directed to a bottom-plan view of an alternative embodiment of a package.

FIG. 6 is directed to a cross-sectional view of an embodiment of a package 300 taken along line B-B in FIGS. 8 and 9. Even though FIGS. 8 and 9 are different embodiments, the cross-sectional views can be represented by FIG. 6. The features of the package 300 in FIG. 6 that are similar or the same as those in the packages 100, 200 in FIGS. 1 and 2 have the same reference numerals as those of the packages 100, 200 in FIGS. 1 and 2. For simplicity and brevity sake of the present disclosure, the details of the similar or the same features will not be discussed in further detail. The discussion above of these similar or same features in packages 100, 200 in FIGS. 1 and 2 applies to the similar or same features of the package 300 in FIG. 6.

The molding compound 104 forms a large, centrally positioned raised portion 308 in this embodiment. The molding compound 104 includes the first surface 124. The molding compound 104 includes a second surface 302, a third surface 304, and a fourth surface 306 that extends from the second surface 302 to the third surface 304. The second surface 302, the third surface 304, and the fourth surface 306 are opposite to the first surface 124. The second surface 302 is closer to the die 102 than the fourth surface 306. The second surface 302 is similar to the second surface 126 of the molding compound 104 as discussed with respect to the package 100 in FIG. 1. The fourth surface 306 is at the angle $\theta_1$ to the second surface 302, and the fourth surface 306 is similar to the second surfaces 130 of the plurality of pillars 106 as discussed above with respect to the package 100 in FIG. 1. The third surface 304 and the fourth surface 306 are exterior-most and side surfaces of the raised portion 308. Similar to the angle $\theta_1$ in the packages 100, 200 that can be transverse, oblique or perpendicular to the second surface 126 of the molding compound 104, the angle $\theta_1$ of the packages 300, 400 may also be transverse, oblique or perpendicular to the second surface 302 of the molding compound 104 in a similar or same fashion.

The raised portion 308 may be referred to as an extension, a pillar, a support structure, a contact support structure, or some other terminology for a portion of the molding compound 104 extending away from the die 102 within the package 100. The raised portion 308 of the molding compound 104 may be referred to as a central portion as the raised portion 308 is closer to the central region of the die 102 than an edge portion 315 of the molding compound 104 that is adjacent to the edges of the die 102. The edge portion 315 is around the raised portion 308 and the die 102.

Unlike the package 100 in FIG. 1, the package 400 has the raised portion 308 that is a single raised portion instead of a plurality of pillars. The raised portion 308 centrally located on the package 400 and aligned with the die 102. The raised portion 308 is wider than each of individual ones of the plurality of pillars 106 when viewed in the cross-sectional views of FIGS. 1 and 6.

A plurality of first conductive layers 310 are on the third surface 304 of the molding compound 104. The plurality of first conductive layers 310 may be referred to as conductive pads, bonding pads, mounting pads, or some other reference for a conductive layer utilized in coupling the package 400 to an external electric component (e.g., a substrate, a PCB, an electrical connection component, etc.). Each of the plurality of first conductive layers 310 have a surface 312, and each of the plurality of first conductive layers 310 are in electrical communication with the die 102.

A distance $d_4$ that extends from the second surface 110 of the die 102 to the surfaces 312 of the first conductive layers 310. A distance $d_5$ that extends from the second surface 302 of the molding compound 104 to the second surface 110 of the die 102. The distance $d_5$ is less than the distance $d_4$. A distance $d_6$ extends from the second surface 110 of the die 102 to the third surface 304 of the molding compound 104. The distance $d_6$ is less than the distance $d_4$ and is greater than the distance $d_5$. A distance $d_7$ extends from the second surface 302 of the molding compound 104 to the third surface 304 of the molding compound 104. The distance $d_7$ is equal to the difference between the distance $d_6$ and the distance $d_5$. The distance $d_6$ is the distance from which the raised portion 308 extends outward and away from the second surface 302 of the molding compound 104.

Second conductive layers 314 are on the second surface 302 of the molding compound 104, the fourth surface 306 of the molding compound 104, and the third surface 304 of the molding compound 104. The second conductive layers 314 is similar to the conductive layers 132 of the package 100. However, unlike the conductive layers 132 of the package 100, the second conductive layers 314 each have a first portion 314a on the second surface 302, a second portion 314b on the fourth surface 306, a third portion 314c on the third surface 304, and a fourth portion 314d extending into the third surface 304 to a corresponding on of the conductive pads 120 of the die 102. The fourth portions 314d are electrically coupled to corresponding ones of the conductive pads 120 of the die 102. The second portion 314b extends from the first portion 314a to the third portion 314c. The fourth portion 314d may be referred to as a conductive via.

The first portions 314a include a surface 316 on which a solder ball 318 is coupled. The solder ball 318 has a point 318a furthest away from the die 102. The point 318a is further away from the die than the surfaces 312 of the first conductive layers 310. This slightly further distance of the point 318a as compared to the surfaces 312 allows the package 300 to be mounted or coupled to an external electrical component without having to form additional solder balls on the first conductive layers 310. For example, when the solder balls 318 are reflowed to mount, couple, or attach the package 300 to an external electrical component, the solder balls reduce in height slight to be substantially equal to the distance $d_4$. This substantial equality allows for the conductive layers to be electrically coupled to conductive layers of the external electrical component.

The solder balls 318 are closer to the sidewalls 128 of the package 300 than the first conductive layers 310. The solder balls 318 are positioned near the sidewalls or edges of the package 300 as the effect of thermal expansion and contraction mismatch between the die 102 and an external electrical component to which the package 300 is mounted due to differences in coefficients of thermal expansion (CTE) is less near the sidewalls 128 and the edges than at location closer to a center of the raised portion 308. There is less bending, flexure, or displacement due to CTE mismatch of the die 102 and the external electrical component near the sidewalls of the die 102, which are spaced apart from the sidewalls 128 of the molding compound 104, as compared to bending, flexure, or displacement between the die 102 and the external electrical component near the center of the die 102. By positioning the solder balls 318 at a location where the effects of CTE mismatch between the die 102 and the external electrical component are at their least, the likelihood of failure or malfunction is significantly decreased as compared to if the solder balls were positioned near the center of the die 102 (e.g., solder balls on the surfaces 312 of the first conductive layers 310).

In some embodiments, a small amount of solder material may be on the surfaces 312 of the first conductive layers 310. The solder material may be utilized to mount or couple the first conductive layers to conductive layers of an external electrical component.

Figure 7:
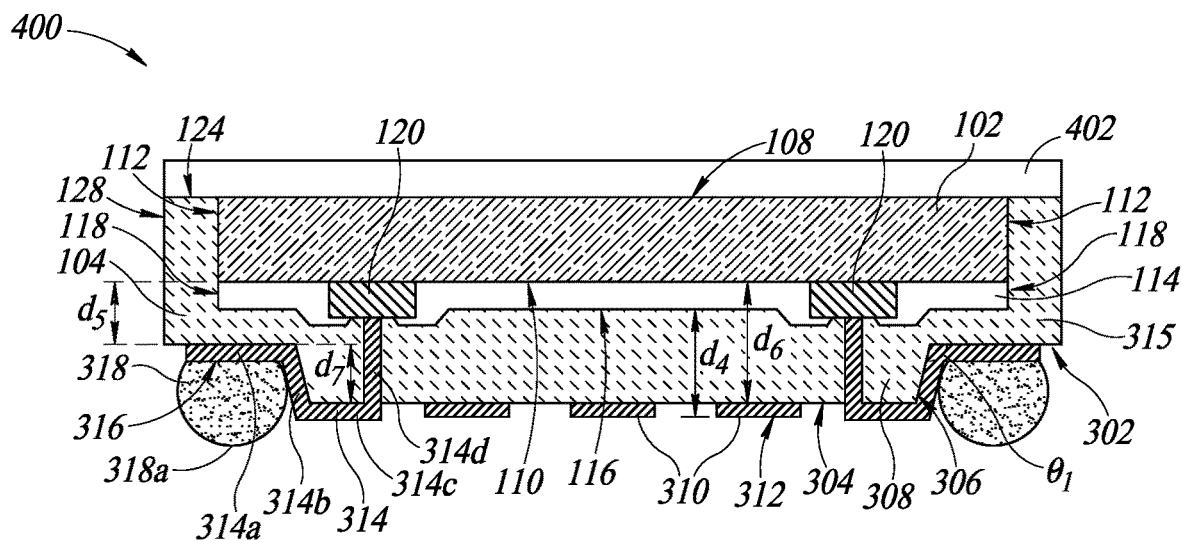
FIG. 7 is directed to a cross-sectional view of an alternative embodiment of a package taken along line B-B in FIGS. 8 and 9, including an insulating layer as compared to the embodiment in FIG. 6.

FIG. 7 is directed to a cross-sectional view of an embodiment of a package 400 taken along B-B in FIGS. 8 and 9. Even though FIGS. 8 and 9 are different embodiments, the cross-sectional views can be represented by FIG. 7. The features of the package 400 in FIG. 7 that are similar or the same as those in the packages 100, 200, 300 in FIGS. 1, 2, and 6 have the same reference numerals as those of the packages 100, 200, 300 in FIGS. 1, 2, and 6. For simplicity and brevity sake of the present disclosure, the details of the similar or the same features will not be discussed in further detail. The discussion above of these similar or same features in packages 100, 200, 300 in FIGS. 1, 2, and 6 applies to the similar or same features in package 400 in FIG. 7.

Unlike the package 300, the package 400 includes an insulating layer 402 on the first surface 124 of the molding compound and the first surface 108 of the die 102. The insulating layer 402 is similar or the same as the insulating layer 202, and the discussion above with respect to insulating layer 202.

FIG. 8 is a bottom-plan view of either of the packages 300, 400 in FIGS. 6 and 7. The fourth surface 306 of the molding compound 104 separates the third surface 304 from the second surface 302. In other words, the fourth surface 306 forms a perimeter or boundary around the third surface 304. The second surface 302 forms a perimeter or boundary around the third surface 304 and the fourth surface 306.

The raised portion 308 is a rectangular frustum or rectangular prism. In some embodiments, the raised portion 308 may be a cylindrical frustum/prism, a square frustum/prism, a trapezoidal frustum/prism, or some other frustum or prism.

The package 300 includes a first edge 317 at the right-hand side of the package 300 and a second edge 319 at the left-hand side of the package 300 based on the orientation of the package 300 in FIG. 6. The fourth surface 306 of the raised portion 308 includes a third edge 321 on the left-hand side of the package 300 where the fourth surface 306 and the second surface 302 come together. The fourths surface 306 of the raised portion 308 includes a fourth edge 323 on the right-hand side of the package 300 where the fourth surface 306 and the second surface 302 come together. A distance $d_{10}$ extends from the fourth edge 323 to the first edge 317, and a distance $d_{11}$ extends from the third edge 321 to the second edge 319. The distances $d_{10}$, $d_{11}$ are substantially equal in FIG. 6. However, in some embodiments, the distances $d_{10}$, $d_{11}$ may be different.

The first portions 314a have a distance $d_{10}$ that is less than the dimensions $d_{10}$, $d_{11}$. The first portions 314a have ends that terminate at a location on the surface 302 that is between the sidewall 128 and the edges 321, 323.

FIG. 9 is a bottom-plan view of either of the packages 300, 400 in FIGS. 6 and 7. In this embodiment in FIG. 9, there are two fourth surfaces 306a, 306b and two second surfaces 302a, 302b. One of the fourth surfaces 306a and one of the second surfaces 302a are on the right-hand side of FIG. 9, and one of the fourth surfaces 306b and one of the second surfaces 306b are on the left-hand side of FIG. 9. The fourth surfaces 306a, 306b separate the second surfaces 302a, 302b, respectively, from the third surface 304 of the molding compound 104. The fourths surfaces extend from a first one of the sidewalls 128 to a second one of the sidewalls 128 that is opposite to the first one of the sidewalls 128.

The raised portion 308 is a rectangular frustum or rectangular prism. In some embodiments, the raised portion 308 may be a square frustum/prism, a trapezoidal frustum/prism, or some other frustum or prism.

The first fourth surface 306a extends between a first edge 325 and a second edge 327 of the raised portion 308. The solder balls 318 on the right-hand side of the package are positioned between the second edge 327 and one of the sidewalls 128 of the package.

The second fourth surface extends between a third edge 329 and a fourth edge 331 of the raised portion 308. The solder balls on the left-hand side of the package are positioned between the fourth edge 331 and one of the sidewalls 128 of the package.

The first fourth surface 306a includes a first end edge 333 at one sidewall 128 and a second end edge 335 that is at another sidewall 128 opposite to the one sidewall 128 at which the first end edge 333 is positioned. The fourth surface 306a extends from the first end edge 333 to the second end edge 335.

The second fourth surface 306b includes a third end edge 337 at one sidewall 128 and a second end edge 339 at another sidewall 128 opposite to the one sidewall 128 at which the third end edge 337 is positioned. The fourth surface 306b extends from the third end edge 337 to the second end edge 339.

FIGS. 10A-10J are cross-sectional views directed to an embodiment of a method of manufacturing the package as shown in FIG. 1 of the present disclosure. Features similar or the same as those shown in FIG. 1 will not be re-described in detail for brevity and simplicity sake of the present disclosure.

Figure 10A:
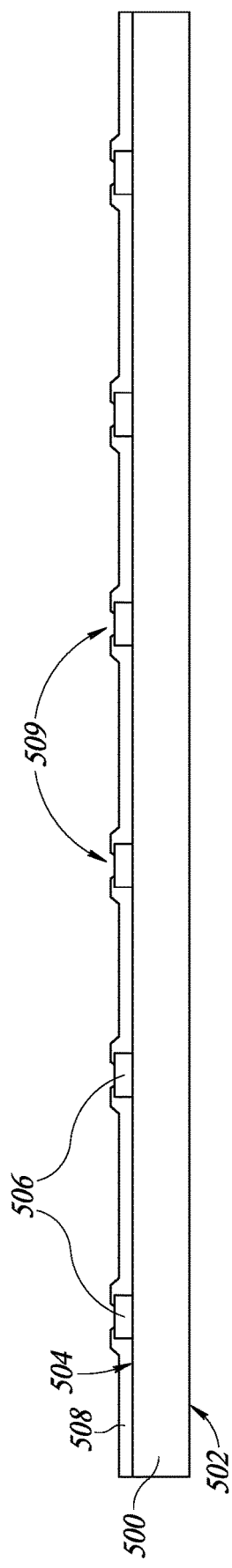
FIGS. 10A-10I are directed to a method of manufacturing the embodiment of the package in FIG. 1.

FIG. 10A is a cross-sectional view of a wafer 500 having a first surface 502 and a second surface 504 that is opposite to the first surface 502. The wafer 500 may be a silicon wafer, a semiconductor wafer, a substrate, a silicon substrate, a semiconductor substrate, a wafer, or some other similar substrate suitable to form a die, a chip, an integrated circuit, or an ASIC. A plurality of conductive pads 506 are on the second surface 504 of the wafer 500 to create electrical connections to the active and passive components formed in each die. The plurality of conductive pads 506 are similar or the same as the plurality of conductive pads 120 as discussed with respect to the package 100 in FIG. 1. The conductive pads 120 may be formed by a number of etching and patterning steps that may include chemical etching, laser etching, photolithography, sawing, or some other etching and patterning steps for forming and patterning a conductive material.

A redistribution layer (RDL) 508 is formed on the second surface 504 of the wafer 500. The RDL 508 is similar or the same as the RDL 114 as discussed with respect to the package 100 in FIG. 1, and the RDL 508 is utilized to form the RDL 114 in the package 100 in FIG. 1. The RDL 508 may be formed utilizing a sputtering technique, a lamination technique, or some other technique for forming an insulating layer, a passivation layer, a repassivation layer, a dielectric layer, or a some other technique for forming and patterning a non-conductive, conductive, or dielectric material. Although the RDL 508 is shown as being a single layer of material, the RDL 508 may be multiple layers of insulating material, conductive material, dielectric material, a photoresist material, non-conductive material, or some other type of materials to form electrical connections between the conductive pads 506 and components within the wafer 500. When forming the RDL 508, openings 509 are formed to expose or leave exposed the conductive pads 506 such that the conductive pads may be electrically coupled to other electrical connections. For example, a photoresist technique with a photoresist material and a mask material may be utilized to form the openings 509 in the RDL 508 to expose the conductive pads 506. Alternatively, the openings 509 may be patterned into the RDL 508 by an etching technique to form the openings and expose the conductive pads 506.

Figure 10B:
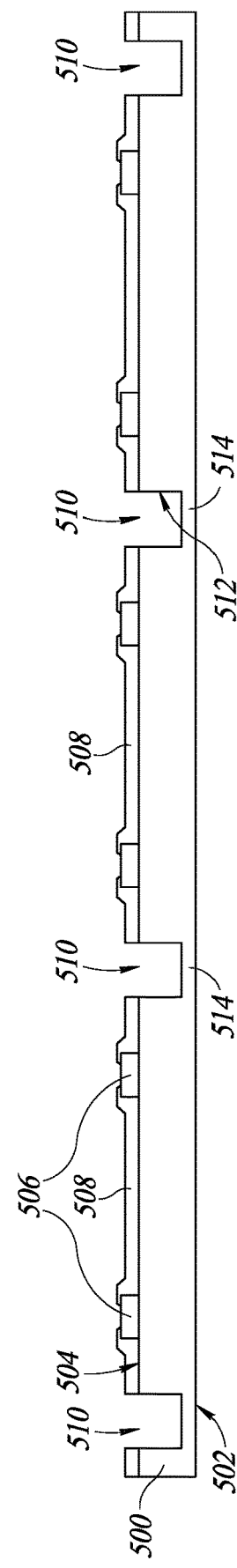

Once the RDL 508 is formed on the second surface of the wafer 500, a plurality of recesses 510 are formed extending into the second surface of the wafer 500 as shown in FIG. 10B. Forming the recesses 510 includes removing portions of the RDL 508 and the wafer 500. The plurality of recesses may be formed by a laser etching technique, a chemical etching technique, a laser drilling technique, a drilling technique, a sawing technique, a grinding technique, or some other technique for removing portions of the wafer 500 and the RDL 508 to form the plurality of recesses 510. Each of the recesses 510 is formed between adjacent ones of the plurality of conductive pads 506. The recesses 510 being formed extending into the second surface of the wafer 500 forms the RDL 114 as present within the package 100 and separates the conductive pads 120 for each die 102 as present within the package 100 in FIG. 1. The recesses 510 are formed to terminate within the wafer 500 and do not extend to the first surface 502 of the wafer 500. The recesses 510 have sidewalls 512 that include a portion of the RDL 508 and a portion of the wafer 500. Portions 514 of the wafer 510 are abutting ends of corresponding ones of the recesses 510 and are aligned with corresponding ones of the recesses 510. The recesses 510 may be trenches, channels, openings, or some other terminology referring to a space formed by removing a portion of the RDL 508 and the wafer 500.

In some embodiments, the recesses 510 may be formed to extend from the second surface 504 to the first surface 502 of the wafer 500 separating and singulating the die 102, which are shown in the package 100 in FIG. 1, from each other.

Figure 10C:
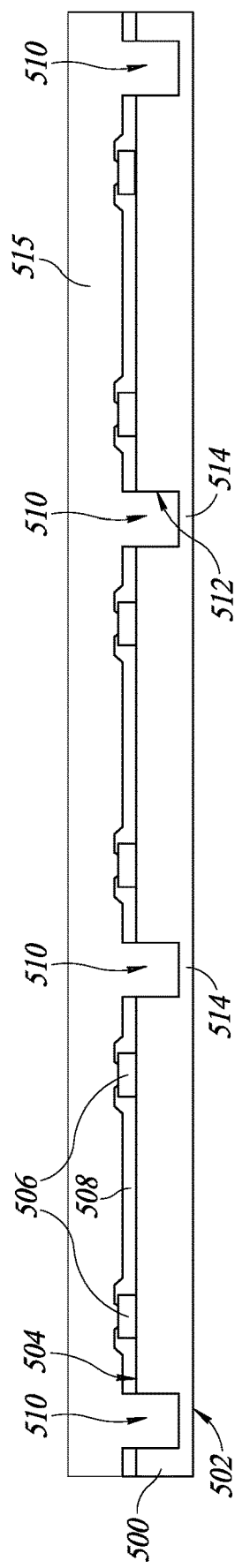

Once the recesses 510 are formed extending into the second surface 504 of the wafer 500, a molding compound 515 is formed on the second surface 504 of the wafer 500 as shown in FIG. 10C. The molding compound 515 covers the conductive pads 506 and the RDL 508, and the molding compound 515 fills the recesses 510. The molding compound 515 is the same or similar to the molding compound 104 as discussed with respect to the package 100 in FIG. 1, and the molding compound 515 is utilized to form the molding compound 104 of the package 100 in FIG. 1. The molding compound 515 may be formed by an injection technique, a compression technique, or some other technique for forming the molding compound on the second surface 504 of the wafer 500 covering the RDL 508 and the conductive pads 506. The molding compound 515 may be formed by an injection molding technique, a compression molding technique, or some other type of molding compound technique.

For example, if an injection molding technique is utilized, a molding tool is placed on a side of the wafer 500 at which the recesses 510 are present. The molding tool may be structured to have a shape corresponding to a plurality of raised portions 516. The molding compound 515 is then injected between the molding tool and the wafer 500 filling the recesses 510 and forming the plurality of raised portions 516. After the molding compound 515 is injected, the molding compound 515 is allowed to cure and harden. The molding compound 515 corresponds to the molding compound 104 as discussed earlier within the present disclosure.

Figure 10D:
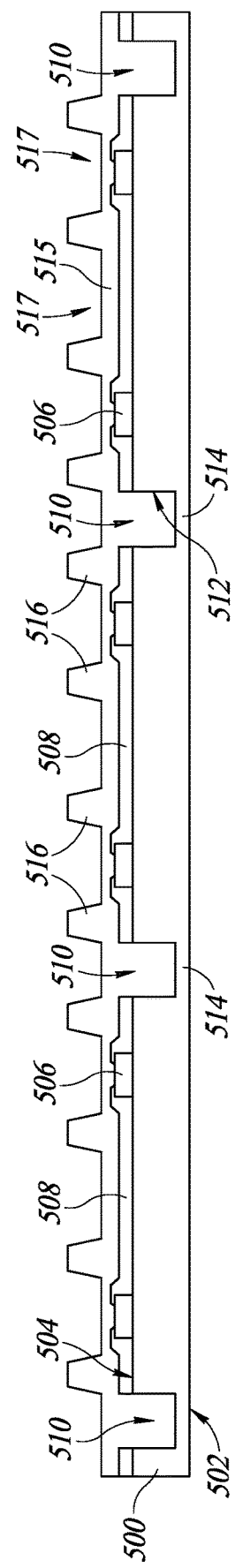

Once the molding compound 515 is formed with the plurality of raised portions 516, in the recesses 510, on the RDL 508, and on the conductive pads 506, the molding compound 515 is lasered, which may be a laser direct structuring (LDS) technique or laser drilling technique, to form first layers of a plurality of conductive layers 518 on the plurality of raised portions 516, which may be an array of raised portions 516, as shown in FIG. 10D. The plurality of raised portions 516 are similar to or the same as the plurality of raised portions 106 as discussed with respect to FIGS. 1 and 2. For example, if a laser drilling technique is utilized to form the raised portions, a laser is directed at locations between each of the plurality of raised portions 516 and the molding compound 515 at those locations is melted, burned, or evaporated by the laser forming first conductive layers the plurality of conductive layers 518 on the plurality of raised portions 516. The first conductive layers of the plurality of conductive layers 518 may be plating layers utilized to form second conductive layers on the first conductive layers. The removal of these portions of the molding compound 515 forms the first conductive layers of the plurality of conductive layers 518 in a plurality of recesses 517 that are between and separate the plurality of raised portions 516 from one another. The recesses 517 may have different distances between adjacent ones of the plurality of raised portions 516, which depends on selected locations the plurality of raised portions 516 are formed by the shape and structure of the molding tool previously utilized to form the molding compound 515.

Figure 10E:
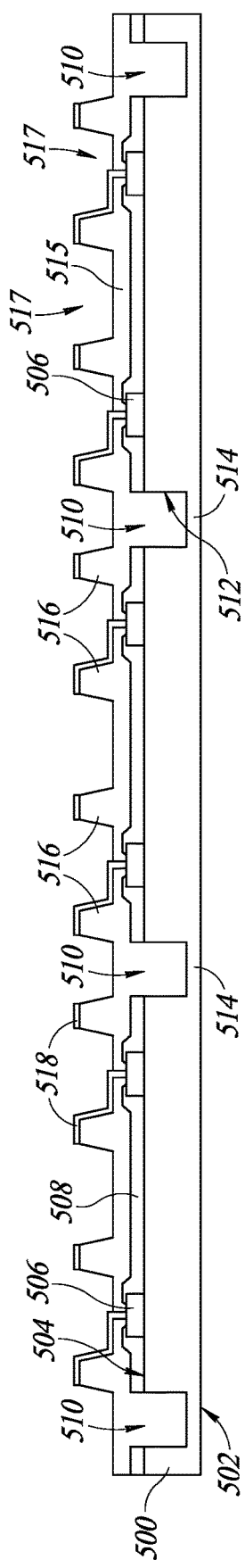

The first conductive layers of the plurality of conductive layers 518 are formed extending into the molding compound 515, formed on the plurality of raised portions 516, and formed to be electrically coupled to corresponding ones of the plurality of conductive pads 506 as shown in FIG. 10E. The plurality of conductive layers 518 are the same or similar to the plurality of conductive layers 132 as discussed with respect to the package 100 in FIG. 1. The first layers plurality of conductive layers 518 are formed on the plurality of raised portions 516 by utilizing laser drilling, plating, and laser direct structuring (LDS) techniques.

First, openings are drilled by a laser extending into the molding compound 515 exposing the conductive pads 506 and activating an additive material within the molding compound 515. The additive material of the molding compound 515 is the same or similar to the additive material of the molding compound 104 as discussed earlier within the present disclosure.

Second, an LDS technique or process is performed, a laser is applied and exposed to the molding compound 515 activating the additive material (e.g., inorganic conductive material) doped within the molding compound 515. In the LDS process, the laser drills into the molding compound forming recesses extending into the molding compound 515 to the conductive pads 506. The sidewalls of the recesses are coated with the first conductive layers (e.g., not shown) formed by activating the additive material by forming the recesses. Successively with forming the recesses having sidewalls covered by the first conductive layers extending to the conductive pads 506, the laser is moved along and over the surface of the molding compound 515 and along and over surfaces of the raised portions 516. As the laser is moved along these surfaces of the molding compound 515 and the raised portions 516, the laser activates the additive material in the molding compound 515 continuing to form and extend the first conductive layers onto the surfaces of the molding compound 515 and the raised portions 516. The first conductive layers may initially be made of a conductive material that is in a liquid or semi-liquid state. The liquid or semi-liquid conductive material solidifies as the laser moves away from the activated additive material forming the first conductive layers. The LDS process forms conductive layers (e.g., not shown) along and at selected surfaces of the molding compound 515 and the raised portions 516. These first conductive layers (e.g., not shown) are utilized to complete the formation of the conductive layers 518, which may be done through a plating process as to be discussed as follows within the present disclosure.

After this LDS process has been performed forming the first conductive layers (not shown) of the plurality of conductive layers 518 on the surfaces of the molding compound 515 and the raised portions 514, a plating process or conductive material formation process is performed to form second conductive layers on the first conductive layers forming the conductive layers 518. In other words, the conductive layers 518 each include a first conductive layer formed during the LDS process and a second conductive layer formed by the plating process that is stacked on the first conductive layer.

The plating process may be an electroless or chemical plating process in which the wafer 500 and the layers on the wafer 500 are placed within a bath containing a conductive material such as a silver material, a gold material, a nickel material, an alloy material, or some other conductive material suitable for an electroless plating process or similar plating process. When in the electroless plating bath, the conductive material in the electroless plating bath is attracted to and coupled to the first conductive layers formed by the LDS process. After the electroless plating process is completed, the second conductive layers are formed on and coupled to corresponding ones of the first conductive layers, respectively, forming the conductive layers 518 and filling the recesses with conductive material. After the electroless plating process is completed, the second conductive layers are formed on the first conductive layers forming the plurality of conductive layers 518.

In some other embodiments of the method of manufacturing, the plating process may be a plating process utilizing an electrolytic solution, an electrodeposition plating process, or some other type of plating process.

Figure 10F:
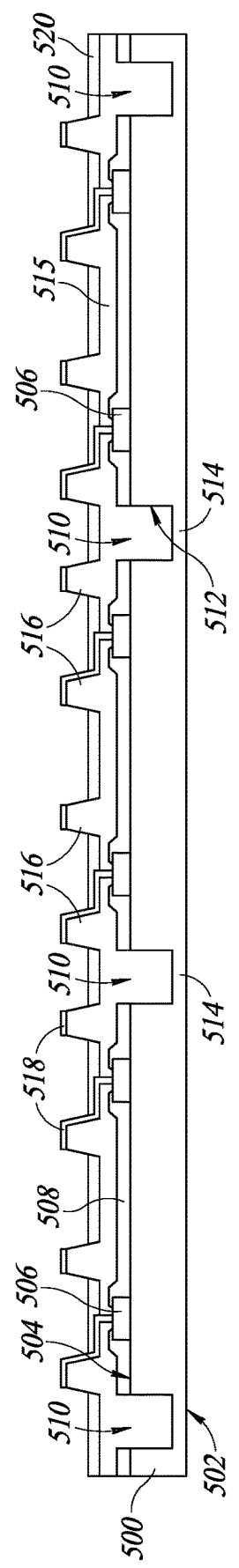

After the conductive layers 518 are formed, an insulating material 520 is formed in the recesses 517 between the raised portions 516 as shown in FIG. 10F. The insulating material 520 may be formed by a sputtering technique, an etching and patterning technique, or some other technique for forming an insulating, non-conductive, or dielectric material within the recesses 517. The insulating material covers portions of the conductive layers 518 to reduce the likelihood of electrical cross-talk between the conductive layers 518 on ones of the raised portions 516 that are adjacent to each other.

Figure 10G:
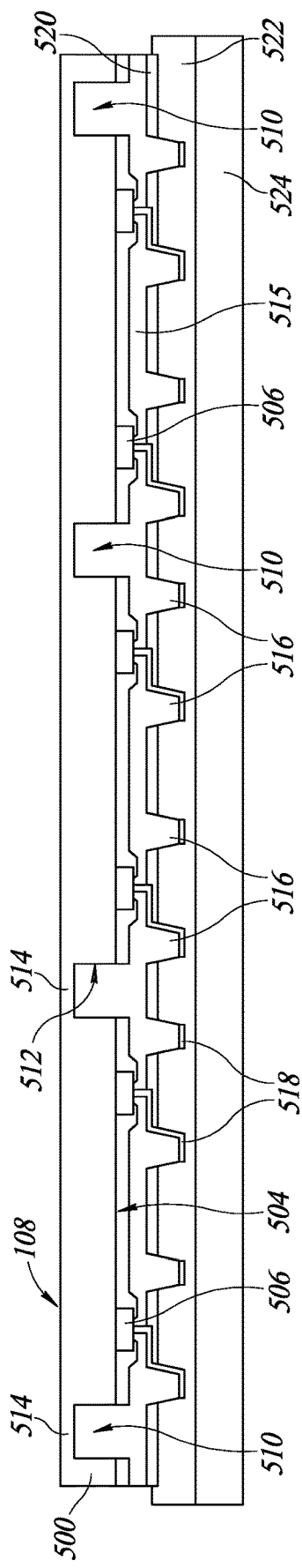

Once the insulating material 520 has been formed in the recesses 517, the wafer 500 and the various materials on the wafer 500 are flipped and attached to an adhesive 522 on a temporary carrier 524 as shown in FIG. 10G. The raised portions 516 extend into the adhesive 522. The adhesive 522 may be a die attach film, a glue, or some other type of temporary adhesive material. The temporary carrier 524 may be a temporary support, a dummy wafer, a kapton tape, a temporary tape, or some other temporary carrier or support.

Figure 10H:
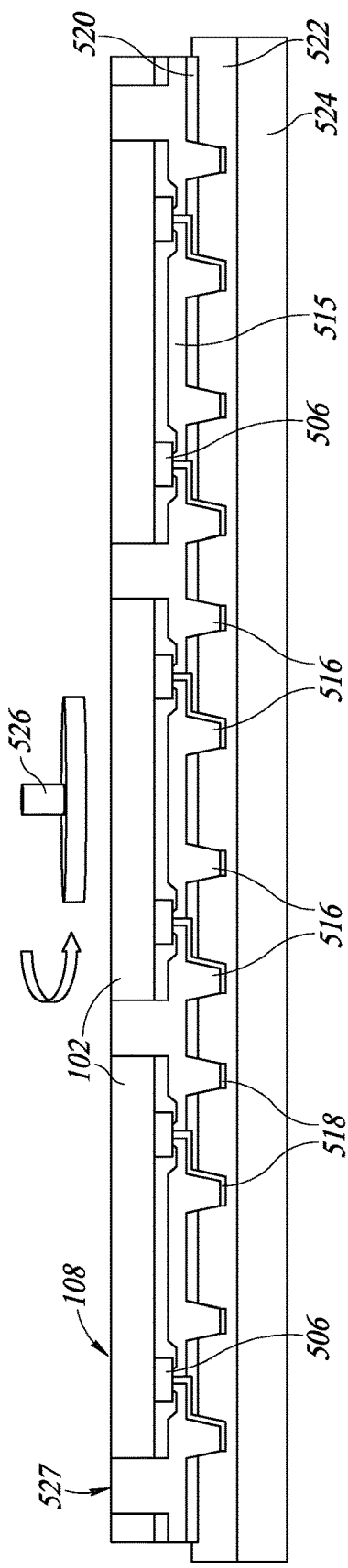

Once the wafer 500 and the various materials on the wafer 500 are attached to the adhesive 522, the first surface 502 of the wafer 500 is grinded to separate and form the die 102 by removing the portions 514 as shown in FIG. 10H. The first surface 502 of the wafer 500 is grinded by a grinding tool 526. The portions 514 of the wafer 500 are removed to separate the wafer 500 into the die 102 as discussed with respect to the package 100 in FIG. 1. The portions 514 are removed by grinding the first surface 502 of the wafer 500 with a grinding tool. Grinding the first surface 502 of the wafer 500 results in the die 102 being thinner relative to the wafer at the beginning of the method shown in FIGS. 10A-10J. The grinding the first surface 502 results in surfaces 527 of the molding compound 515 and the surfaces 108 of the die 102 being substantially co-planar with each other. The surfaces 527 of the molding compound 515 are utilized to form the surfaces 124 of the molding compound 104 in the package 100.

In some embodiments, the portions 514 at the first surface 502 of the wafer 500 may be removed by a laser, a chemical etching, or some other type of removal technique.

Figure 10I:
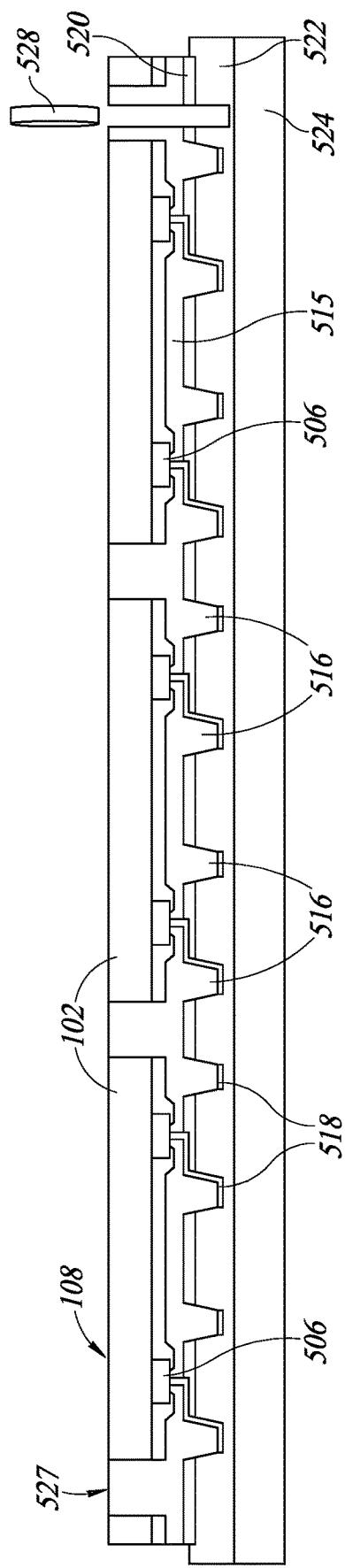

Once the first surface 502 of the wafer 500 has been grinded to separate the individual die 102, the die 102 and the various materials on the die 102 are singulated by a singulation tool 528 as shown in FIG. 10I. The singulation tool 528 may be a laser, a saw, a drill, or some other type of singulation tool.

Once the die 102 and the various materials are singulated into the package in FIG. 1, the packages 100 are removed from the adhesive 522 and the temporary carrier 524. For example, the packages 100 may be removed from the adhesive 522 and the temporary carrier 524 by a pick and place machine.

FIG. 10J is one of the packages 100 that is formed by the method of manufacturing as shown in FIGS. 10A-10J.

Figure 11A:
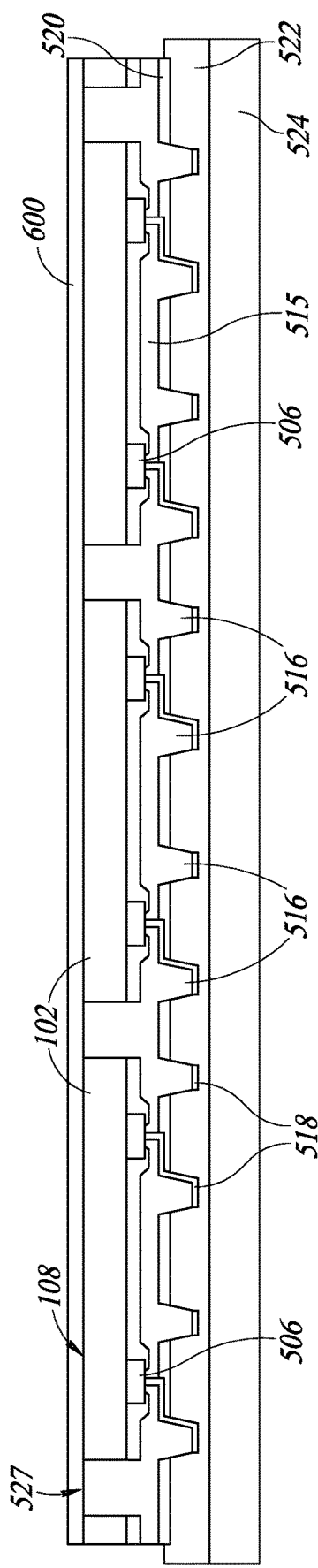
FIGS. 11A and 11B are directed to a method of manufacturing the embodiment of the package in FIG. 2.
Figure 11B:
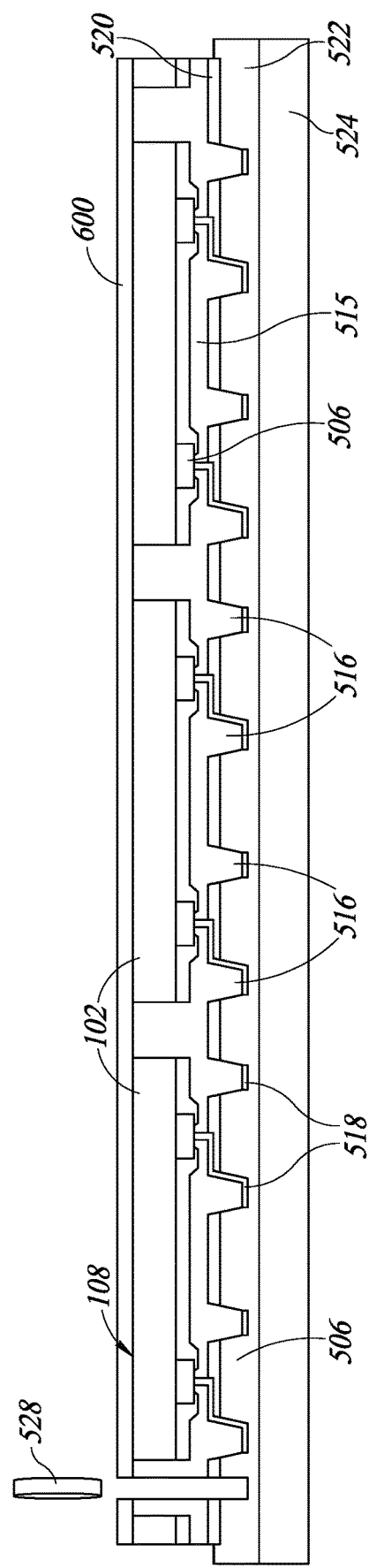
Figure 12A:
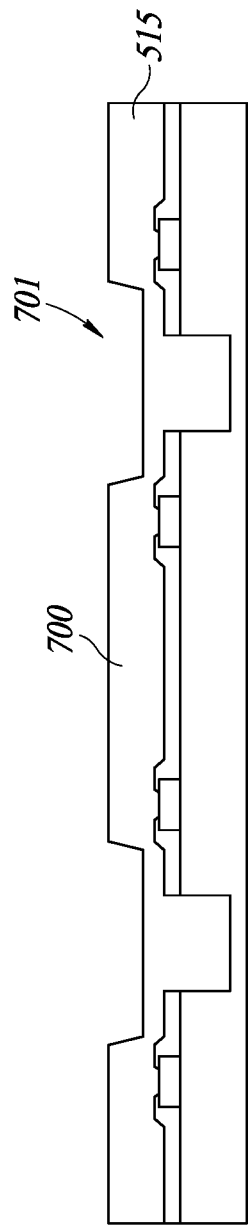
Figure 12B:
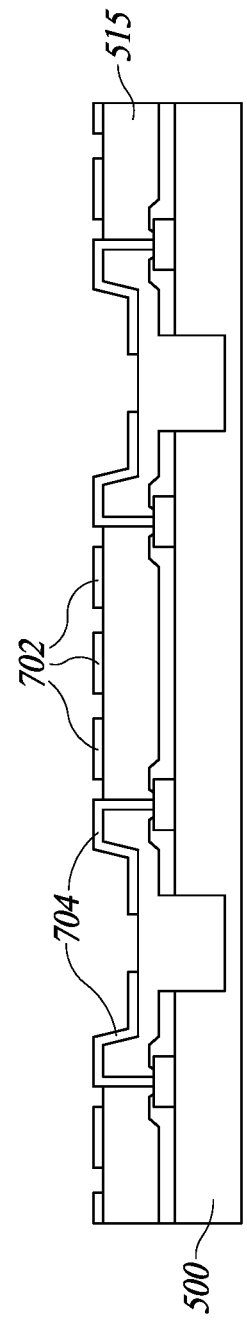

FIGS. 11A-11C are directed to a method of manufacturing the package 200 as shown in FIG. 2. The method of manufacturing the package 200 is the same or similar to the method of manufacturing the package 100 as shown in FIGS. 10A-10J. For the sake of simplicity and brevity of the present disclosure, only differences between the method of manufacturing the package 200 as compared to the method of manufacturing the package 100 will be discussed in further detail as follows. Similar or the same features in the method of manufacturing the package 200 in FIGS. 11A-11C will have the same or similar reference numerals as those features in the method of manufacturing the package 100 in FIGS. 10A-10J. The method of manufacturing the package 200 includes the steps from FIGS. 10A-10H, however, after the step I FIG. 10H, the method of manufacturing the package 200 is different from the method of manufacturing the package 100.

Unlike the method of manufacturing the package 100 as show in FIGS. 10A-10J, the method of manufacturing the package 200 includes an additional step after the grinding step in FIG. 10I for forming the package 100. Otherwise, the method of manufacturing the package 200 in FIG. 2 is the same or similar to the method of manufacturing the package 100. The additional step in the method of manufacturing the package 200 in FIG. 2 is forming an insulating layer 600 on the surfaces 527 of the molding compound 515 and the surfaces 108 of the die 102. The insulating layer 600 is utilized to form the insulating layer 202 in the package 200 as shown in FIG. 2.

Once the insulating layer 600 has been formed, the die 102 and the various materials are singulated in a similar or same fashion as discussed with respect to the method of forming the package 100 in FIGS. 10A-10J. This singulation step is shown in FIG. 11B.

FIG. 11C is one of the packages 200 formed by the method of manufacturing as shown in FIGS. 11A-11C.

FIGS. 12A-12G are directed to a method of manufacturing the package 300 as shown in FIG. 6. The method of manufacturing the package 300 is the same or similar to the method of manufacturing the package 100 as shown in FIGS. 10A-10J. For the sake of simplicity and brevity of the present disclosure, only differences between the method of manufacturing the package 300 and the method of manufacturing the package 100 will be discussed in further detail as follows. Similar or the same features in the method of manufacturing the package 300 in FIGS. 12A-12G will have the same or similar reference numerals as those features in the method of manufacturing the package 100 in FIGS. 10A-10J.

The method of manufacturing the package 300 includes the steps from 10A-10C, however, after the step in FIG. 10C, the method of manufacturing the package 300 is different than the method of manufacturing the package 100.

Once the molding compound 515 has been formed on the second surface 504 of the wafer 500 as shown in FIG. 10C, the molding compound 515 is lasered, which is completed in the same or similar manner as the lasering or etching as discussed with respect to FIG. 10D. However, unlike the lasering step in FIG. 10D, the molding compound is lasered to form the first conductive layers on and extending into the raised portions 700. The raised portions 700 are separated by recesses 701 where the molding compound 515 similar to the recesses 517 in the molding compound 515 as shown in FIG. 10E.

Once the molding compound 515 is lasered to form first conductive layers (not shown) on and extending into the raised portions 700, a plurality of conductive pads 702 and a plurality of conductive layers 704 are formed as shown in FIG. 12 by performing a plating process similar to the plating process as discussed with respect to FIG. 10E. The conductive layers 704 correspond to the conductive layers 314 in the package 300 as shown in FIG. 6. The conductive layers 704 are formed by forming second conductive layer (not shown) on the first conductive layers in the same or similar manner as discussed with respect to forming the conductive layers 518 as shown in FIG. 10E. In other words, the conductive layers 704 and pads 702 include ones of the first conductive layers and the second conductive layers. The conductive layers 704 and conductive pads 702 may be formed by a plating technique, an etching technique, a patterning technique, a photolithography technique, or some other formation technique or combination of formation techniques for forming conductive pads.

Once the conductive pads 702 and the conductive layers 704 are formed, a plurality of solder balls 706 are formed on the conductive layers 704 as shown in FIG. 12C. The solder balls 706 may be formed by a reflow technique, a solder ball placement technique, or some other solder ball formation technique or combination of solder ball formation techniques. The solder balls 706 correspond to the solder balls 318 of the package 300 as shown in FIG. 6.

Once the solder balls 706 are formed on the conductive layers 704, the wafer 500 and the materials on the wafer 500 are flipped and coupled to the adhesive 522 on the temporary carrier 524. The solder balls 706 and the raised portions 700 extend into the adhesive 522 on the temporary carrier.

Once wafer 500 and the materials on the wafer 500 are coupled to the adhesive 522 of the temporary carrier 524, the wafer 500 and the materials on the wafer are further processed and singulated in the same or similar manner as shown in FIGS. 10H-10I to grind the first surface 502 of the wafer 500 as shown in FIG. 10H, and singulate the die 102 and the materials on the die 102 into individual ones of the packages 300 as shown in FIG. 6.

Figure 13:
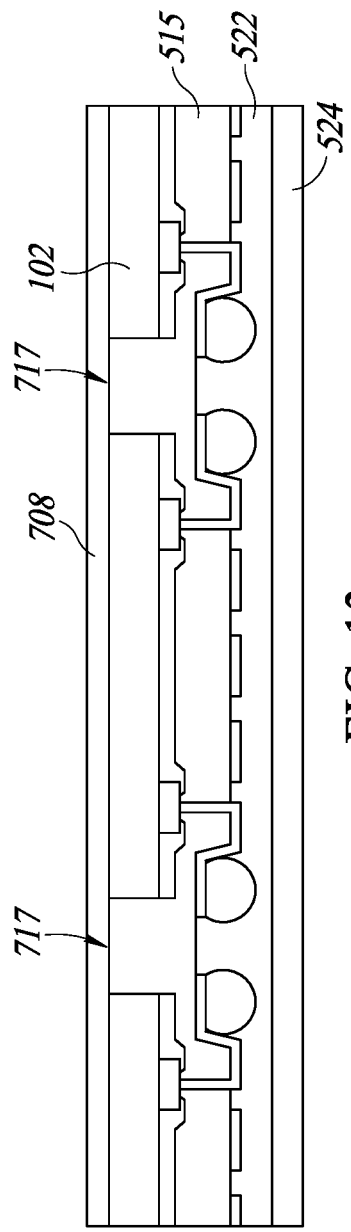
FIG. 13 is directed to a method of manufacturing the embodiment of the package in FIG. 7.

FIG. 13 is directed to a method of manufacturing the package 400 as shown in FIG. 7. The method of manufacturing the package 400 is the same or similar to the method of manufacturing the package 300 as discussed with respect to FIGS. 12A-12E. For the sake of simplicity and brevity of the present disclosure, only differences between the method of manufacturing the package 400 and the method of manufacturing the package 300 will be discussed in further detail as follows.

Once the wafer 500 has been grinded to separate the dice 102 from one another, an insulating layer 708 is formed on surfaces 717 of the molding compound 515 between ones of the dice 102 and on the first surfaces 108 of the dice 102. The insulating layer 708 is utilized to form the insulating layer 402 in the package 400 as shown in FIG. 7. The insulating layer 708 is formed in the same or similar fashion as forming the insulating layer 600 as discussed with respect to and as shown in FIG. 11A.

Once the insulating layer 708 has been formed, the dice 102 and the various materials on the dice 102 are singulated in a similar or same fashion as discussed with respect to the method of forming the package 100 in FIGS. 10A-10J. This singulation step is shown in FIG. 11B.

Figure 14A:
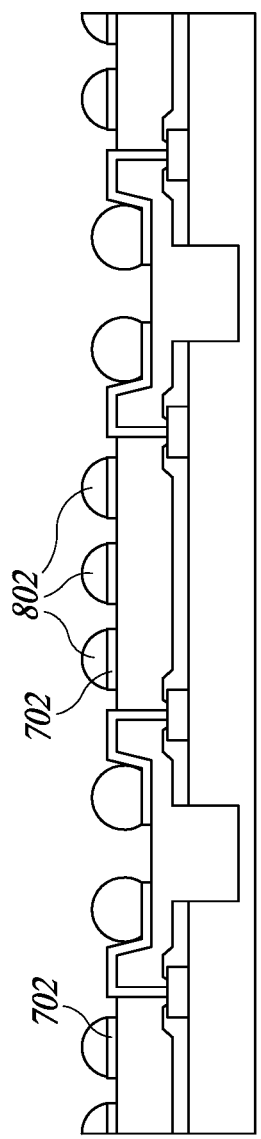

FIG. 14A is directed to a method of forming packages 800, 900 that are the same or similar to the packages 300, 400. However, unlike the packages 300, 400, the packages 800, 900 include solder portions 802 that are formed on the conductive layers 310. The solder portions 802 may be formed using the same or similar techniques as forming the solder balls 706. The solder portions 802 may be formed at the same time as the solder balls 706 or may be formed at a different point within the methods of manufacturing as set forth above.

FIGS. 14B and 15 are directed to the packages 800, 900 with the solder portions 802. Points furthest away from the die 102 of each of the solder portions 802 are substantially co-planar with points of the solder balls 706 furthest away from the die 102. This co-planarity of these points allows for the packages 800, 900 to be mounted or coupled to an external electrical component such that the packages 800, 900 are level with respect to the external electrical component.

In view of the above discussions, the solder balls of the conventional WLCSPs are no longer required in the above embodiments at all of the electrical connections between the WLCSPs and an external electrical component, or at some of the electrical connections between the WLCSPs and an external electrical component. By removing the need for the solder balls at either all or some of the electrical connections between the WLCSPs and the external electrical component, the effects of the coefficient of thermal expansion (CTE) mismatch between a die of the conventional WLCSPs and an external electrical component (e.g., PCB) to which the conventional WLCSPs are mounted may be reduced. For example, the pillars or the raised portions of the embodiments of the WLCSPs of the present disclosure may be formed to space the die of the WLCSPs of the present disclosure from the PCB to which the WLCSPs of the present disclosure are mounted by a selected dimension, which may be selected to reduce the effects of CTE mismatch between the die of the WLCSPs of the present disclosure and the PCB to which the WLCSPs of the present disclosure are mounted.

In view of the above discussions, the solder balls of the conventional WLCSPs are no longer required at each and every conductive pad of the conventional WLCSPs when coupling the conventional WLCSPs to the PCB. By removing the need for the solder balls at each and every conductive pad, the effects of the CTE mismatch between the die of the conventional WLCSPs and the PCB to which the conventional WLCSPs are mounted may be reduced. For example, the pillar or the raised portion may be at a central portion of the WLCSPs of the present disclosure and solder balls may present along edges of the WLCSPs of the present disclosure. The expansion and contraction difference caused by the CTE mismatch at edges of the WLCSPs of the present disclosure and the PCB is less than that at the central portion of the WLCSPs of the present disclosure and the PCB. This lesser difference of expansion and contraction reduces the effects of CTE mismatch between the die of the WLCSPs of the present disclosure and the PCB to which the WLCSPs of the present disclosure are mounted.

In view of the above discussion, the CTE mismatch between the die in the WLCSPs and the external electrical component to which the WLCSPs are mounted may be significantly mitigated to significantly increase the lifespan or usability of an electronic device by reducing the likelihood of failure in these electrical connections. This means that the WLCSPs as disclosed have a greater robustness against thermal-cycling on board (TCOB) effects caused by CTE mismatch due to rapid changes in temperature (e.g., cold to hot, or hot to cold). In other words, the reliability of the packages and robsutiness of the electrical connections are significantly increased as compared to conventional WLCSPs that only utilized solder balls and all of the electrical connections between the WLCSPs and the external electrical component.

The distances $d_1$, $d_2$, $d_3$, $d_4$, $d_5$, $d_6$, $d_7$, $d_8$, $d_9$, $d_{10}$, $d_{11}$ discussed herein within the present disclosure may be referred to as dimensions, lengths, thicknesses, widths, or some other suitable terminology for dimensionality.

A package may be summarized as including a die having a first surface, a second surface opposite to the first surface, the die including a plurality of conductive pads on the second surface; a polymer on the second surface of the die, the polymer including a plurality of pillars extending away from the second surface of the die; and a plurality of conductive layers, each conductive layer being on one of the plurality of pillars, each conductive layer extends through the polymer and is coupled to one of the plurality of conductive pads.

The die may include sidewalls extending from the first surface to the second surface and the polymer may be co-planar with the first surface of the die.

Portions of the polymer may extend between adjacent ones of the plurality of pillars and couple adjacent ones of the plurality of pillars to each other.

The polymer may include a third surface; and each one of the plurality of pillars may include a fourth surface the fourth surfaces being further away from the die than the third surface.

Each pillar may include an inclined sidewall between the third surface and the fourth surface.

Each of the plurality of conductive layers may include a first portion on the third surface of the polymer, on the fourth surface of a respective one of the plurality of pillars, and a third portion on the inclined sidewall of the respective one of the plurality of pillars.

An insulating layer may be on the third surface of the polymer, and may be on the first portions and the second portions of the conductive layers.

The polymer may include a third surface substantially coplanar with the first surface of the die.

An insulating layer may be on the first surface of the die and may be on the third surface of the polymer.

A package may be summarized as including a die having a first surface and a second surface opposite to the first surface; a molding compound on the second surface of the die, the molding compound including a third surface; and a first extension extending from the third surface; and a first conductive layer on the first extension, the first conductive layer extends through the molding compound and is coupled to the die.

The first extension may include a fourth surface and a first inclined surface extending from the third surface to the fourth surface.

The first conductive layer may include a first portion on the fourth surface, a second portion on the first inclined surface, a third portion on the third surface, and a fourth portion extending into the third surface, the fourth portion coupled to the die.

The molding compound may include a second extension extending from the third surface, the second extension including a fifth surface and a second inclined surface extending from the third surface to the fifth surface.

The package may further include a second conductive layer that may be on the fifth surface, on the second inclined surface, on the third surface, extends into the third surface, and may be coupled to the die.

A package may be summarized as including a die having a first surface and a second surface opposite to the first surface, the die including a first conductive pad on the first surface; a polymer on the second surface of the die, the polymer including a third surface, a fourth surface further away from the die than the third surface, and an inclined surface extending from the third surface to the fourth surface; and a first conductive layer having a first portion on the third surface, a second portion on the inclined surface, a third portion on the fourth surface, and a fourth portion extending into the fourth surface and coupled the first conductive pad.

The die may include a second conductive pad.

The package may further include a second conductive layer having a fifth portion on the third surface, a sixth portion on the inclined surface, a seventh portion on the fourth surface, and an eighth portion extending into the fourth surface and coupled to the second conductive pad.

The die may include a plurality of sidewalls; and the polymer covers the sidewalls.

The polymer may include a fifth surface substantially coplanar with the first surface of the die.

An insulating layer may be on the second surface of the die and on the fifth surface of the polymer.

The package may further include a conductive pad at the fourth surface of the polymer, the conductive pad being coupled to the die.

A package may be summarized as including a die having a first surface and a second surface opposite to the first surface; a polymer on the second surface of the die, the polymer having a first sidewall, a second sidewall opposite to the first sidewall, a third surface, a fourth surface further away from the die than the third surface, a fifth surface extending from the third surface to the fourth surface at an incline, the fifth surface extending from the first sidewall to the second sidewall; and a first conductive layer having a first portion on the third surface, a second portion on the fifth surface, a third portion on the fourth surface, and a fourth portion extending into the fourth surface and coupled to the polymer.

The polymer may further include a sixth surface closer to the die than the fourth surface, and a seventh surface extending from the sixth surface to the fourth surface at an incline, the seventh surface extending from the first sidewall to the second sidewall.

The package may further include a second conductive layer having a fifth portion on the sixth surface, a sixth portion on the seventh surface, a seventh portion on the fourth surface, and an eighth portion extending into the fourth surface and coupled to the die.

A conductive pad may be at the fourth surface of the polymer, the conductive pad being coupled to the die.

The polymer may further include a ninth surface substantially coplanar with the first surface of the polymer.

An insulating layer may be on the first surface of the die and the ninth surface of the polymer.

A method may be summarized as including forming a redistribution layer and a conductive pad on a first surface of a wafer; forming a molding compound on the first surface of the wafer covering the redistribution layer and the conductive pad; forming a first pillar of molding compound, the first pillar having a first surface, a second surface further away from the wafer than the first surface, and a third surface extending from the first surface to the second surface at an incline; forming an opening in the molding compound exposing the conductive pad; and forming a conductive layer on the molding compound, the conductive layer having a first portion on the second surface, a second portion on the third surface, a third portion on the first surface, and a fourth portion in the opening coupled to the conductive pad.

The method may further include forming a recess extending into the first surface of the wafer laterally adjacent to the redistribution layer and the conductive pad.

Forming the molding compound may include forming the molding compound in the recess.

The method may further include coupling the first pillar to a carrier by an adhesive on the carrier.

Coupling the first pillar to a support by an adhesive may further include inserting the first pillar in the adhesive.

The method may further include grinding a second surface of the wafer opposite to the first surface.

A method may be summarized as including forming a redistribution layer and a first conductive pad on a first surface of a wafer; forming a molding compound on the first surface of the wafer covering the redistribution layer and the first conductive pad; forming a second surface, a third surface, and a fourth surface of the molding compound by patterning the molding compound, the third surface being further away from the wafer than the second surface, the fourth surface extending from the second surface to the third surface by a first incline; forming a first opening extending into the third surface in the molding compound exposing the first conducive pad; and forming a first conductive layer on the molding compound, the first conductive layer having a first portion on the second surface, a second portion on the fourth surface, a third portion on the third surface, and a fourth portion in the first opening coupling the fourth portion to the first conductive pad.

The method may further include forming a second conductive pad on the first surface of the wafer; forming a second opening extending into the third surface in the molding compound exposing the second conductive pad; and forming a second conductive layer on the molding compound, the second conductive layer having a fifth portion on the on the second surface, a sixth portion on the fourth surface, a seventh portion on the third surface, and an eighth portion in the second opening coupling the eighth portion to the second conductive pad.

The method may form a plurality of conductive pads at the third surface of the molding compound, the conductive pads being coupled to the wafer.

Forming the second surface, the third surface, and the fourth surface of the molding compound by patterning the molding compound may further include forming a fifth surface closer to the wafer than the third surface and a sixth surface extending from the fifth surface to the third surface by a second incline.

Forming the third surface may further include separating the fourth surface from the sixth surface.

A device may be summarized as including a die having a plurality of contact pads on a first surface; a dielectric layer on the first surface and on sidewalls of the die, the dielectric layer including an edge portion spaced from the die by a first distance; and a central portion spaced from the die by a second distance that is greater than the first distance; and a first conductive layer on the edge portion, on the central portion and coupled to one of the plurality of contact pads on the die.

The device may further include an inclined surface that extends from the edge portion to the central portion.

The device may further include a conductive layer on a surface of the edge portion, on a surface of the central portion, and on the inclined surface.

The conductive layer may extend into the central portion to a respective one of the plurality of contact pads.

A device may be summarized as including a die having a plurality of contact pads; a dielectric layer on the plurality of contacts and on sidewalls of the die, the dielectric layer including a first surface spaced from the die by a first distance; and a second surface spaced from the die by a second distance that is less than the first distance; and a first conductive layer first surface, on the second surface, and coupled to one of the plurality of contact pads on the die.

The dielectric layer may include a contact support structure that extends outward from a surface of the dielectric layer facing away from the die by a first dimension.

The first dimension may be a selected dimension based on a first coefficient of thermal expansion of the die and a second coefficient of thermal expansion of an external component that the first conductive layer may be coupled.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A package, comprising:
   a die having a first surface, a second surface opposite to the first surface, a plurality sidewalls that extends from the first surface to the second surface and includes a first sidewall and a second sidewall opposite to the first sidewall, and the die including:
   a plurality of conductive pads on the second surface, the plurality of conductive pads including first conductive pads and second conductive pads spaced apart from the first conductive pads;
   a polymer on the second surface of the die, the polymer including a plurality of pillars extending away from the second surface of the die, each respective pillar of the plurality of pillars has a respective end, the plurality of pillars includes a plurality of first pillars spaced inward from the first conductive pads and the second conductive pads of the plurality of conductive pads and a plurality of second pillars spaced outward from the plurality of conductive pads, the plurality of first pillars are between the first conductive pads and the second conductive pads, at least one respective second pillar of the plurality of second pillars is between the first conductive pads and the first sidewall, and at least another respective second pillar of the plurality of second pillars is between the second conductive pads and the second sidewall, and the respective ends of the plurality of first pillars are level with the respective ends of the plurality of second pillars; and
   a plurality of conductive layers, each respective conductive layer of the plurality of conductive layers being on a corresponding pillar of the plurality of pillars, extending through the polymer, being coupled to a corresponding conductive pad of the plurality of conductive pads, and being exposed at a corresponding end of the plurality of first pillars and the plurality of second pillars of the plurality of pillars.

2. The package of claim 1, wherein the polymer is co-planar with the first surface of the die.

3. The package of claim 1, wherein portions of the polymer extend between adjacent pillars of the plurality of pillars and couple the adjacent pillars of the plurality of pillars to each other.

4. The package of claim 1, wherein:
   the polymer includes a third surface; and
   each respective pillar of the plurality of pillars includes a fourth surface at their respective ends, and the fourth surfaces of the plurality of pillars being further away from the die than the third surface.

5. The package of claim 4, wherein each pillar includes an inclined sidewall between the third surface and a corresponding fourth surface of the fourth surfaces of the plurality of pillars.

6. The package of claim 5, wherein each of the plurality of conductive layers includes a first portion on the third surface of the polymer, on the fourth surface of a corresponding one of the plurality of pillars, and a third portion on the inclined sidewall of the corresponding one of the plurality of pillars.

7. The package of claim 6, further comprising an insulating layer that is on the third surface of the polymer, and is on the first portion of the plurality of conductive layers and a second portion of the plurality of conductive layers.

8. The package of claim 1, wherein the polymer includes a third surface substantially coplanar with the first surface of the die.

9. The package of claim 8, wherein an insulating layer is on the first surface of the die and is on the third surface of the polymer.

10. A package, comprising:
    a die having a first surface and a second surface opposite to the first surface;
    a molding compound on the second surface of the die, the molding compound including:
    a third surface;
    a first extension extending from the third surface, the first extension including a fourth surface spaced apart from the third surface; and
    a second extension extending from the third surface, the second extension including a fifth surface spaced apart from the third surface;
    a first conductive layer on the fourth surface of the first extension, the first conductive layer extends through the molding compound and is coupled to the die, and the first conductive layer includes a first contact pad exposed at the fourth surface of the first extension; and
    a second conductive layer on the fourth surface of the first extension, the second conductive layer extends through the molding compound and is coupled to the die, and the second conductive layer includes a second contact pad exposed at the fourth surface of the first extension;
    a third conductive layer on the fifth surface of the second extension, the third conductive layer extends through the molding compound and is coupled to the die, and the third conductive layer includes a third contact pad exposed at the fifth surface of the second extension; and
    a fourth conductive layer on the fifth surface of the second extension, the fourth conductive layer extends through the molding compound and is coupled to the die, and the fourth conductive layer includes a fourth contact pad exposed at the fifth surface of the second extension.

11. The package of claim 10, wherein the first extension further includes a first inclined surface extending from the third surface to the fourth surface.

12. The package of claim 11, wherein:
the first conductive layer includes a first portion on the fourth surface, a second portion on the first inclined surface, a third portion on the third surface, and a fourth portion extending into the third surface, the fourth portion being coupled to the die, and
the second conductive layer includes a fifth portion on the fourth surface, a sixth portion on the first inclined surface, a seventh portion on the third surface, and an eighth portion extending into the third surface, the eighth portion being coupled to the die.

13. The package of claim 11, wherein the second extension includes a second inclined surface extending from the third surface to the fifth surface.

14. The package of claim 13, wherein:
the third conductive layer includes a first portion on the fifth surface, a second portion on the second inclined surface, a third portion on the third surface, and a fourth portion extending into the third surface, the fourth portion being coupled to the die; and
the fourth conductive layer includes a fifth portion on the fifth surface, a sixth portion on the second inclined surface, a seventh portion on the third surface, and an eighth portion extending into the third surface, the eight portion being coupled to the die.

15. A package, comprising:
a die including:
a first surface;
a second surface opposite to the first surface;
a first sidewall that extends from the first surface to the second surface;
a second sidewall that extends from the first surface to the second surface and is opposite to the first sidewall;
a plurality of contact pads including:
a first set of contact pads spaced inward from the first sidewall of the die, and
a second set of contact pads between the first set of contact pads and the second sidewall;
a polymer on the second surface of the die, the polymer including a plurality of pillars, a third surface spaced apart from the second surface of the die, a third sidewall transverse to the third surface, and a fourth sidewall transverse to the third surface and opposite to the third sidewall, the plurality of pillars extend away from the second surface of the die and the third surface of the polymer, the plurality of pillars includes a first group of pillars between the first set of contact pads of the die and the third sidewall of the polymer, a second group of pillars between the first set of contact pads and the second set of contact pads of the die, and a third group of pillars between the second set of contact pads and the second group of pillars, and each respective pillar of the plurality of pillars including:
a pillar end surface at which the respective pillar terminates; and
a pillar sidewall of the respective pillar that extends from the end surface of the respective pillar to the third surface;
a plurality of conductive layers on the plurality of pillars, each respective conductive layer of the plurality of conductive layers being on a corresponding pillar end surface of the plurality of pillars and on a corresponding pillar sidewall of the plurality of pillars.

16. The package of claim 15, wherein:
the plurality of conductive layers are on the third surface of the polymer and extend into the third surface of the polymer to a corresponding contact pad of the plurality of contact pads.

17. The package of claim 15, wherein the pillar end surfaces of the plurality of pillars have a profile of at least one of the following of a circular profile, a square profile, and a rectangular profile.

18. The package of claim 15, wherein the pillar sidewalls of the plurality of pillars are inclined.

19. The package of claim 15, further comprising an insulating layer on the third surface of the polymer, and wherein respective portions of the one or more conductive layers are between the insulating layer and the third surface of the polymer.

20. The package of claim 15, wherein:
the first group of pillars of the plurality of pillars overlap the first sidewall of the die; and
the second group of pillars of the plurality of pillars overlap the second sidewall of the die.

* * * * *